(12) United States Patent
Kojima

(10) Patent No.: US 8,212,540 B2
(45) Date of Patent: Jul. 3, 2012

(54) VOLTAGE GENERATING CIRCUIT

(75) Inventor: Tomokazu Kojima, Osaka (JP)

(73) Assignee: Panasonic Corporation, Osaka (JP)

( * ) Notice: Subject to any disclaimer, the term of this patent is extended or adjusted under 35 U.S.C. 154(b) by 966 days.

(21) Appl. No.: 12/207,965

(22) Filed: Sep. 10, 2008

(65) Prior Publication Data

US 2009/0072801 A1    Mar. 19, 2009

(30) Foreign Application Priority Data

Sep. 14, 2007  (JP) .................................. 2007-238998

(51) Int. Cl.
*G05F 1/56* (2006.01)

(52) U.S. Cl. ........................................................ 323/273

(58) Field of Classification Search .......... 323/273–279; 327/538, 543
See application file for complete search history.

(56) References Cited

U.S. PATENT DOCUMENTS

| | | | | |
|---|---|---|---|---|
| 5,283,762 A * | 2/1994 | Fujishima | ................. | 365/189.09 |
| 5,455,535 A * | 10/1995 | Sauer | ............................. | 327/560 |
| 5,546,045 A * | 8/1996 | Sauer | ............................. | 327/561 |
| 6,844,839 B2 | 1/2005 | Lee et al. | | |
| 7,158,108 B2 | 1/2007 | Hagino | | |
| 7,190,357 B2 | 3/2007 | Ohta et al. | | |
| 7,456,680 B2 * | 11/2008 | Gyohten et al. | .............. | 327/541 |
| 7,755,337 B2 * | 7/2010 | Negoro | ......................... | 323/277 |
| 7,843,245 B2 * | 11/2010 | Jung | ............................ | 327/307 |
| 2005/0146316 A1 * | 7/2005 | Kim | ............................. | 323/316 |
| 2007/0262812 A1 * | 11/2007 | Gyohten et al. | .............. | 327/540 |

FOREIGN PATENT DOCUMENTS

JP    2006-318381    11/2006

OTHER PUBLICATIONS

Tutorial Paper / CMOS Operation Amplifier, 5. Setting of Transistor Parameters, pp. 1-3.
Low-Voltage Analog Design Considerations, Low-Voltage Low-Power CMOS Operational Amplifier Cells, pp. 5-87.

* cited by examiner

*Primary Examiner* — Adolf Berhane
(74) *Attorney, Agent, or Firm* — McDermott Will & Emery LLP

(57) ABSTRACT

A voltage generating circuit according to the present invention comprises a voltage converter which voltage-converts a reference voltage, and an output unit which impedance-converts the voltage outputted from the voltage converter. The voltage converter and the output unit each comprise a low-voltage-side power supply and a high-voltage-side power supply. A voltage level of the high-voltage-side power supply in the output unit is set to be higher than a voltage level of the high-voltage-side power supply in the voltage converter.

44 Claims, 7 Drawing Sheets

F I G. 1
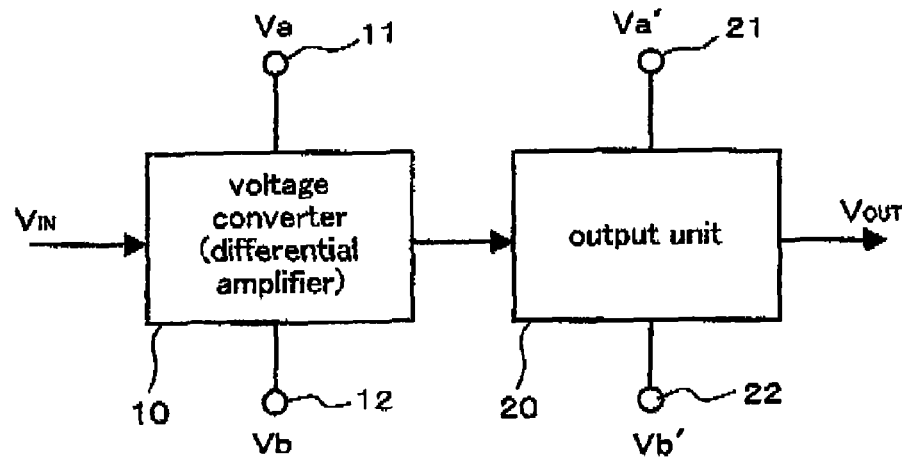
F I G. 2
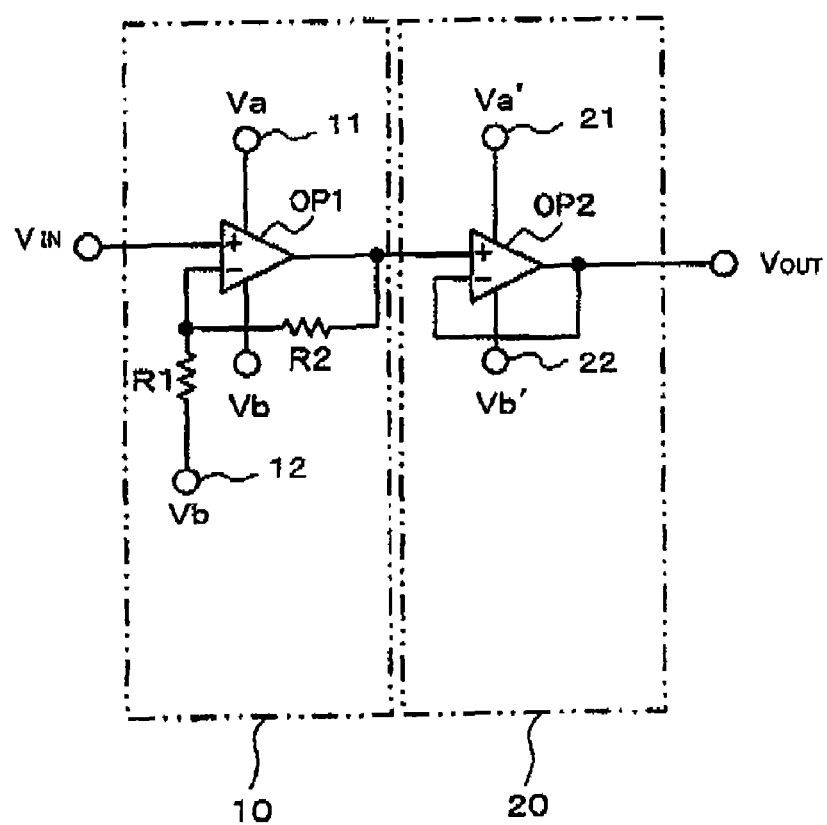

F I G. 3
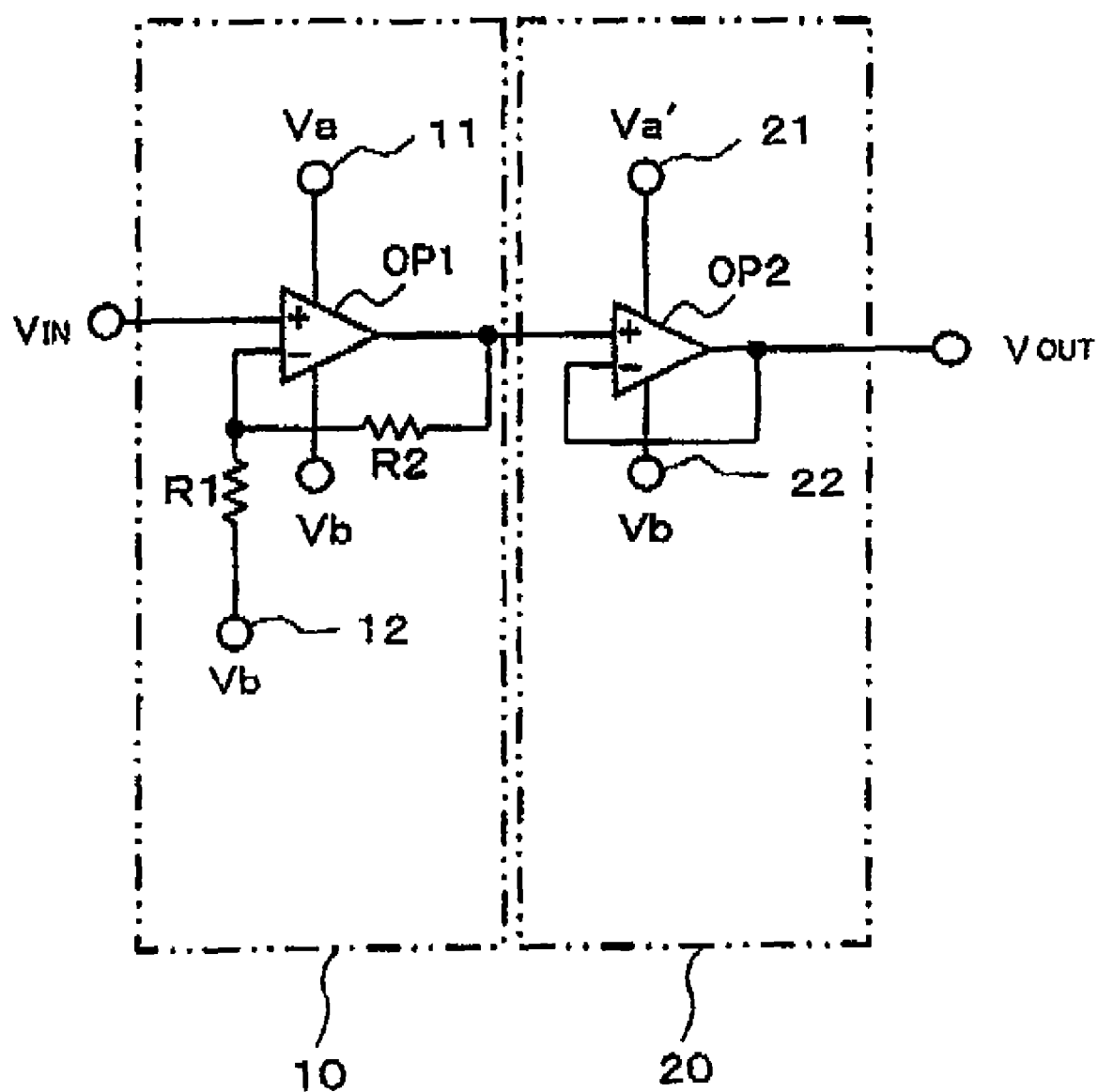

VOLTAGE GENERATING CIRCUIT

BACKGROUND OF THE INVENTION

1. Field of the Invention

The present invention relates to a voltage generating circuit comprising a voltage converter which inputs a reference voltage thereto and voltage-converting the inputted reference voltage, and an output unit which impedance-converts the voltage outputted from the voltage converter and outputs the converted voltage, more particularly to a technology for realizing such drive performance that achieve a high speed and a low impedance. The present invention is suitably applied, for example, to a liquid crystal display device wherein a liquid crystal display driver, a control circuit, RAM, and the like are mixedly provided.

2. Description of the Related Art

The following constitutions are conventionally known in an operational amplifier: a circuit configuration wherein a rail-to-rail operational amplifier is adopted to amplify an entire range of power supply voltages; and a configuration which realize a voltage generating circuit capable of outputting a grayscale voltage suitable for liquid crystal display at low power consumption and in a small area by dividing a circuit system for each voltage (for example, see 2006-318381 of the Japanese Patent Applications Laid-Open). Also known are a rail-to-rail operational amplifier, a gain-boost operational amplifier and a rail-to-rail operational amplifier which also serves as a gain-boost type at the same time. A rail-to-rail operational amplifier means an operational amplifier which is operable in the whole range of the power supply voltages and driven at a high speed. An operable range of an operational amplifier of this type includes a whole range of voltages between a high-voltage-side power supply voltage VDD and a low-voltage-side power supply voltage VSS.

In a mobile device, a typical example of which is a mobile telephone, and a car navigation system, lower voltages are increasingly used as a power supply voltage because it is demanded that power consumption in terminals and devices be desirably reduced, and dielectric breakdown voltages in transistors, such as a digital circuit and RAM, are dropping as a gate oxide film becomes thinner along with the miniaturization of a semiconductor process.

Further, in a liquid crystal display driver, although there has been a trend that a power supply voltage for the driver is lowered as the display device attains a higher definition and a larger screen, there is a market demand that the grayscale voltage should have a wider range and be set high so as to improve image brightness.

A circuit which generates a grayscale voltage generates a voltage suitable for the liquid crystal display by dividing resistances and using band gap reference, switched capacitor, or the like. More specifically, the grayscale voltage generating circuit voltage-converts a reference voltage inputted to a voltage converter (differential amplifier), and impedance-converts the resulting voltage in an output unit and then outputs it to thereby generate one grayscale voltage. In the case of multi-level grayscales, a plurality of amplifiers are provided so that a plurality of voltages suitable for the liquid crystal display are generated.

FIG. 9 is a drawing schematically illustrating a conventional voltage generating circuit, and FIG. 10 is a circuit diagram which more specifically illustrates the circuit. Referring to reference numerals shown therein, 10 denotes a voltage converter which voltage-converts a reference voltage $V_{IN}$, and 20 denotes an output unit which impedance-converts the voltage outputted from the voltage converter 10 and outputs the resultant voltage. The voltage converter 10 comprises an operational amplifier OP1 which is a differential amplifier. A voltage of a high-voltage-side power supply of the operational amplifier OP1 is Va, and a voltage of a low-voltage-side power supply thereof is Vb. The output unit 20 comprises an operational amplifier OP2 which is a voltage follower. A voltage of a high-voltage-side power supply of the operational amplifier OP2 is also Va, and a voltage of a low-voltage-side power supply thereof is also Vb. Vc denotes a ground level.

The voltage generating circuit inputs the reference voltage as the input voltage $V_{IN}$, and then generates the grayscale voltage for the liquid crystal display as an output voltage $V_{OUT}$ based on image data for the liquid crystal display, and supplies the generated output voltage $V_{OUT}$ to a γ generating circuit in a source driver (data line driving circuit) and an output buffer at each terminal of the source driver. In recent years, with regard to the output voltage $V_{OUT}$ (grayscale voltage) of the voltage generating circuit, a higher voltage is demanded as the brightness and the grayscale in the liquid crystal display device are increasingly advanced, while the voltage is reduced particularly when it is used as a power supply voltage in a mobile telephone.

The voltage converter 10 generates the input voltage $V_{IN}$ which ranges from the power supply voltage Va on the high-voltage side through the power supply voltage Vb on the low-voltage side by subjecting the input voltage $V_{IN}$ to resistance division processing and non-inversion amplification processing, and then generates the grayscale voltage suitable for the liquid crystal display based on the input voltage $V_{IN}$. The output unit 20 impedance-converts the voltage generated in the voltage converter 10 and outputs the resultant voltage. The voltage is impedance-converted because loads are driven at a high speed when large input impedances are converted into small output impedances.

In the conventional voltage generating circuit, in order to satisfy two demands contradictory to each other: the reduction of the power supply voltage and the increase of the grayscale voltage, the power supply voltage is limitedly reduced within a certain range, the range of the grayscale voltage are broadened, and the rail-to-rail operational amplifier is adopted so as to efficiently utilize the given voltage range.

The method illustrated in FIGS. 9 and 10, however, has the following three problems. The first problem is that the power reduction is unfavorably limited because the power supply voltage can only be reduced within a certain range.

The second problem is as described below. The grayscale voltage is given to the γ generating circuit and the buffers in the source driver serving as the load. The γ generating circuit is often configured to have several-ten kΩ order resistances. In order to drive the voltage generating circuit thus constituted, it is necessary to supply the current obtained when the grayscale voltage is divided by several tens of k Ω. Further, when the buffers in the source drive are connected, input capacitance as much as the number of channels serves as a load in the case where all of the buffers are connected, which often results in the nF order resistance. When such a load as relatively large resistance or capacitance is driven, it is difficult to drive it at a high speed by a voltage equal to or near the power supply voltage even though the rail-to-rail operational amplifier is used. In the case where resistance is a load, the voltage is divided between the resistance as the load and the resistance in the γ generating circuit unless the output impedance is reduced, which causes an error in an output voltage to occur.

The third problem is that it is difficult even for the rail-to-rail operational amplifier to drive voltages in the voltage range including the power supply voltage and voltages near the power supply voltage because the output transistor is operated in a non-saturation region, which changes the output impedance, and as a result, an error in the output voltage occurs.

SUMMARY OF THE INVENTION

Therefore, a main object of the present invention is to provide a voltage generating circuit configured to prevent the increase of current consumption and the increase of a chip area.

In order to achieve the foregoing object, 1) a voltage generating circuit according to the present invention comprises a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, and a voltage level of the high-voltage-side power supply in the output unit is set to be higher than a voltage level of the high-voltage-side power supply in the voltage converter. FIG. 1 for a preferred embodiment of the present invention described later can be referred to for this constitution.

In the constitution wherein the voltage level of the high-voltage-side power supply in the output unit is set to be higher, a transistor in the output unit is operated outside of a non-saturation region. Therefore, voltages near the power supply voltage including the voltage of the high-voltage-side power supply can be speedily outputted at a low impedance.

2) A voltage generating circuit according to the present invention comprises a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, a voltage difference between the high-voltage-side power supply and the low-voltage-side power supply in the voltage converter is set to be equal to or smaller than a voltage difference between the high-voltage-side power supply and the low-voltage-side power supply in the output unit, and a dielectric breakdown voltage of the voltage converter is set to be equal to or smaller than a dielectric breakdown voltage of the output unit. FIG. 3 for a preferred embodiment of the present invention described later can be referred to for this constitution.

In the forgoing constitution wherein the voltage difference between the power supplies in the output unit is larger, the transistor in the output unit is operable outside of the non-saturation region. Furthermore, the supply having the voltages appropriate for a voltage output range of the output unit are provided. Therefore, the dielectric breakdown voltage of the element (transistor) constituting the output unit can be equal to or lower than that of the voltage converter. As a result, the voltages near the power supply voltage including the voltage of the high-voltage-side power supply can be speedily outputted at a low impedance, and further, a circuit area can be reduced.

3) A voltage generating circuit according to the present invention comprises:

a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, a voltage difference between the high-voltage-side power supply and the low-voltage-side power supply in the voltage converter is set to be higher than a voltage difference between the high-voltage-side power supply and the low-voltage-side power supply in the output unit, and a dielectric breakdown voltage of the voltage converter is set to be higher than a dielectric breakdown voltage of the output unit.

The foregoing constitution is effective in the case where the output voltage range of the output unit is narrow. The power supply voltages, which have a voltage range broader than the output voltage range of the output unit, and narrower than the voltage output range of the voltage converter are supplied. As a result, the element having the dielectric breakdown voltage equal to or lower than the power supply voltage of the output unit can constitute the output unit, which realizes even a smaller circuit area and a lower impedance.

4) In the voltage generating circuits constituted as recited in 1)-3), the output unit may further comprise a breakdown voltage controller for limiting the output voltage after the impedance conversion with reference to the voltage of the high-voltage-side power supply of the voltage converter. FIG. 5 for a preferred embodiment of the present invention described later can be referred to for this constitution. The voltage generating circuit thus constituted, wherein the output unit further comprises the breakdown voltage controller, can unfailingly prevents the generation of such an output voltage that exceeds a value obtained when a threshold voltage or a forward or backward saturation voltage is added to the voltage of the high-voltage-side power supply of the voltage converter.

5) In the voltage generating circuit constituted as recited in 4), the breakdown voltage controller may be any of:

a diode comprising a cathode to which the voltage of the high-voltage-side power supply in the voltage converter is supplied;

a bipolar transistor comprising an emitter and a base, wherein the emitter and the base are short-circuited relative to each other, and the voltage of the high-voltage-side power supply in the voltage converter is supplied to the base; and an MOS transistor comprising a source and a gate, wherein the source and the gate are short-circuited relative to each other, and the voltage of the high-voltage-side power supply in the voltage converter is supplied to the gate. FIG. 5 for a preferred embodiment of the present invention described later can be referred to for this constitution.

6) In the voltage generating circuit constituted as recited in 5), the MOS transistor may comprise an N well and a P well, wherein the voltage of the high-voltage-side power supply in the voltage converter is supplied to the N well, and the voltage of the low-voltage-side power supply in the output unit is supplied to the P well so that a dielectric breakdown voltage of the MOS transistor is set to be equal to or lower than the dielectric breakdown voltage of the voltage converter or the dielectric breakdown voltage of the output unit. FIG. 6 for a preferred embodiment of the present invention described later can be referred to for this constitution. In a process where at least three wells are provided, a ground level or a high-voltage-side power supply, which are voltages not included in transistor symbols, are conventionally supplied in relation to voltages of an N well in a Pch MOS transistor and a P well in an Nch MOS transistor. In contrast, in the constitution wherein the low-voltage-side power supply of the output unit is supplied, the dielectric breakdown voltage of the element constituting the breakdown voltage controller can be configured to equal to or lower than the dielectric breakdown voltages of the elements constituting the voltage converter and the output unit. Because the dielectric breakdown voltage of the element constituting the breakdown voltage controller can be set to be lower, a capacity of the element acting as a protective element can be dramatically improved in comparison to the dielectric breakdown voltage being higher, and further, the circuit area can be further reduced.

7) A voltage generating circuit according to the present invention comprises:

a voltage converter for voltage-converting a reference voltage; and an output unit for impedance-converting the voltage outputted from the voltage converter, wherein a low-voltage-side power supply and a high-voltage-side power supply are connected to the voltage converter, the output unit comprises a plurality of first operational amplifiers, at least a low-voltage-side power supply and at least a high-voltage-side power supply are connected to the first operational amplifier, output voltages of the high-voltage-side power supply and the low-voltage-side power supply in the first operational amplifier are set to stay within a voltage difference range between a voltage higher than an output voltage of the high-voltage-side power supply in the voltage converter and a voltage lower than an output voltage of the low-voltage-side power supply in the voltage converter, and a dielectric breakdown voltage of the output unit is set to be equal to or lower than a dielectric breakdown voltage of the voltage converter. FIGS. 7 and 8 for a preferred embodiment of the present invention described later can be referred to for this constitution.

A multi-functional liquid crystal driver available in recent years includes many functional elements such as RAM, controller, source driver, step-up circuit, and power supply circuit. In such case, transistors having various dielectric breakdown voltages and power supply voltages are provided in relation to functions thereby exerted. According to the foregoing constitution, when the transistors having a plurality of power supplies and a plurality of dielectric breakdown voltages are utilized, the breakdown voltage can be reduced and the power supply voltage can be optimized in the operational amplifier constituting the output unit without any additional power supply or transistor having a different dielectric breakdown voltage. As a result, power consumption can be reduced, the circuit area can be curtailed, and, a higher speed and a lower impedance can be further realized.

8) The voltage generating circuit constituted as recited in 7) may further comprise an output selecting switch for turning on and off output of the first operational amplifiers, wherein the output unit comprises an output terminal, the output selecting switch and the output terminal are connected to each other, and a dielectric breakdown voltage of the output selecting switch is set to be equal to or lower than the dielectric breakdown voltage of the voltage converter. FIGS. 7 and 8 for a preferred embodiment of the present invention described later can be referred to for this constitution. In the voltage generating circuit thus constituted, wherein the output selecting switch which turns on and off the output is provided, and the breakdown voltage of the operational amplifier can be surely reduced without relying on the output elements and circuits when the output selecting switch is controlled.

9) In the voltage generating circuit constituted as recited in 8), an output voltage of the first operational amplifier at the time of power activation and in a non-operating state may be fixed to a power supply voltage or a voltage in a power supply voltage range of the first operational amplifier. Thus constituted, the plurality of operational amplifiers can be surely controlled so that their output voltages can stay within their power supply voltage ranges even at the time of power activation and in the non-operating state. As a result, the reduction of the breakdown voltage can be further ensured.

10) In the voltage generating circuit constituted as recited in 8), the output selecting switch selects one of outputs of the plurality of first operational amplifiers, and when the outputs of the plurality of first operational amplifiers are switched, before the output selecting switch connected to a first operational amplifier subsequently selected is turned on, the operational amplifier subsequently selected outputs the power supply voltage or a voltage in a power supply voltage range thereof, and when an output voltage of the output terminal becomes equal to the above described power supply voltage or a voltage level in the above described power supply voltage range, the above described output selecting switch connected to the first operational amplifier subsequently selected is turned on. Thus constituted, when the first operational amplifier is selected in order to increase the output voltage, the output voltage of the first operational amplifier subsequently selected is changed in advance to reach the power supply voltage or the voltage in the power supply voltage range, and then, in the subsequent operational, the changed output voltage is actually outputted from the first operational amplifier subsequently selected. As a result, the dielectric breakdown voltages of the elements constituting the first operational amplifiers are surely reduced, and a higher speed can be achieved.

11) In the voltage generating circuits constituted as recited in 1), 2), 3) and 7), the voltage converter may comprise an operational amplifier (second operational amplifier) provided with an input terminal to which the reference voltage is inputted and an output terminal;

a variable resistance connected to the output terminal; and a controller for controlling the operational amplifier (second operational amplifier), wherein the operational amplifier (second operational amplifier) is configured to operate as a voltage follower in accordance with the control by the controller and thereby divides an output voltage thereof by the variable resistance and outputs the divided voltage. Thus constituted, the voltage range outputted from the voltage converter to the output unit can be finely controlled.

12) In the voltage generating circuits constituted as recited in 1), 2), 3) and 7), the voltage converter may comprise an operational amplifier (second operational amplifier) provided with an input terminal to which the reference voltage is inputted, an inversion input terminal and an output terminal;

a variable resistance connected to the output terminal and ground; and a controller for controlling the operational amplifier (second operational amplifier), wherein the operational amplifier (second operational amplifier) is configured to operate as a non-inversion amplifier, and the variable resistance has a plurality of resistance-dividing points connected to the inversion input terminal and selects the resistance-dividing points in accordance with the control by the controller.

13) In the voltage generating circuits constituted as recited in 1), 2), 3) and 7), the voltage converter may comprise an operational amplifier (second operational amplifier) provided with an input terminal to which the reference voltage is inputted, an inversion input terminal and an output terminal;

a variable resistance connected to the output terminal and the input terminal; and a controller for controlling the operational amplifier (second operational amplifier), wherein the operational amplifier (second operational amplifier) is configured to operate as an inversion amplifier, and the variable resistance has a plurality of resistance-dividing points connected to the inversion input terminal and selects the resistance-dividing points in accordance with the control by the controller.

14) In the voltage generating circuits constituted as recited in 11)-13), the variable resistance may comprise a plurality of resistances serially connected to each other; and resistance selecting switches provided between a connecting point at which the adjacent resistances are connected to each other and the output terminal, wherein the resistance selecting switches open and close in accordance with the control by the controller.

15) In the voltage generating circuits constituted as recited in 1), 2), 3) and 7), a differential amplifier can constitute the voltage converter.

16) In the voltage generating circuits constituted as recited in 1), 2), 3) and 7), a source follower can constitute the output unit.

According to the present invention, the power supply voltage and voltages near the power supply voltage can be speedily and accurately outputted at a low impedance, and the generation of any voltages exceeding the power supply voltage can be reliably prevented. As a result, a gray scale voltage capable of driving any voltage in an entire voltage range can be generated even though a power supply voltage for a liquid crystal display device is reduced.

The effect exerted by the present invention thus characterized is that in a display device such as a liquid crystal panel, liquid crystal driver and liquid crystal TFT element, any voltages exceeding the dielectric breakdown voltage are surely prevented from being supplied from the output of the voltage generating circuit to elements such as a liquid crystal driver and liquid crystal TFT while power consumption being reduced. Therefore, the present invention can advantageously contribute to the development of a stable liquid crystal display device in which a high contrast and a high definition are achieved.

According to the technology of the present invention, the power supply voltage and voltages near the power supply voltage can be speedily outputted at a low impedance in the voltage generating circuit such as a liquid crystal driver. Further, the various power supplies and transistors having the different breakdown voltages, which are mixedly provided in a system, can be used for the implementation of the present invention. Therefore, power can be supplied with low power consumption in such a manner that a high drive performance is assured. These technologies of the present invention are very useful for the area reduction in a circuit and a system.

BRIEF DESCRIPTION OF THE DRAWINGS

These and other objects as well as advantages of the invention will become clear by the following description of preferred embodiments of the invention and be specified in the claims attached hereto. A number of benefits not recited in this specification will come to the attention of the skilled in the art upon the implementation of the present invention.

FIG. 1 is a block diagram illustrating a constitution of a voltage generating circuit according to a preferred embodiment 1 of the present invention.

FIG. 2 is a circuit diagram illustrating the constitution of the voltage generating circuit according to the preferred embodiment 1.

FIG. 3 is a circuit diagram illustrating a constitution of a voltage generating circuit according to a modified embodiment of the preferred embodiment 1.

DETAILED DESCRIPTION OF THE INVENTION

Figure 4:
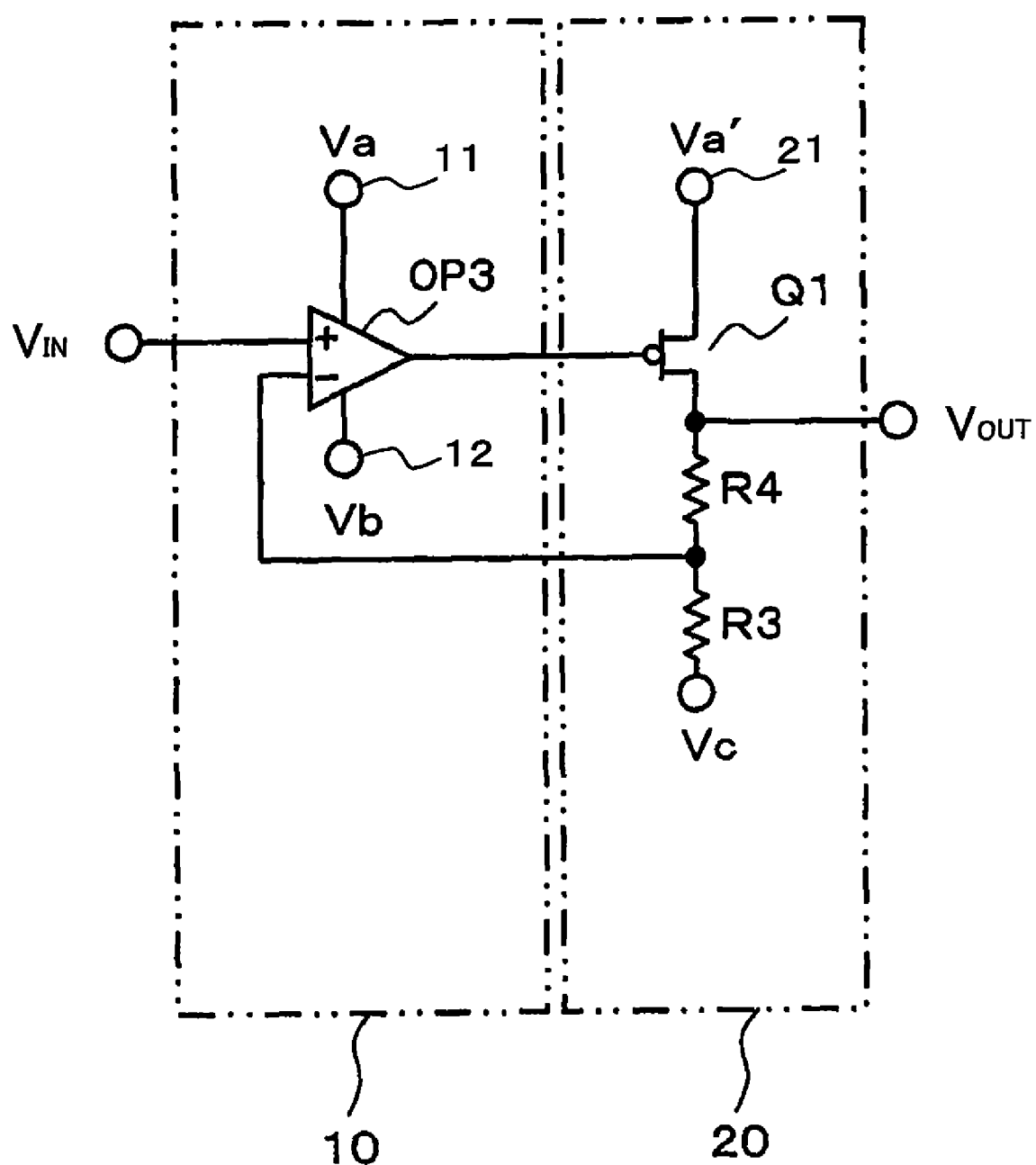
FIG. 4 is a circuit diagram illustrating a constitution of a voltage generating circuit according to another modified embodiment of the preferred embodiment 1.

Hereinafter, preferred embodiments of a voltage generating circuit according to the present invention are described in detail referring to the drawings.

PREFERRED EMBODIMENT 1

FIG. 1 is a block diagram illustrating a constitution of a voltage generating circuit according to a preferred embodiment 1 of the present invention. FIG. 2 is a circuit diagram more specifically illustrating the constitution shown in FIG. 1. The voltage generating circuit comprises a voltage converter (differential amplifier) 10 and an output unit 20. A non-inversion amplifier provided with an operational amplifier OP1, a resistance R1 and a resistance R2 constitutes the voltage converter (differential amplifier) 10. The operational amplifier OP1 comprises an input terminal, an inversion input terminal and an output terminal. A high-voltage-side power supply 11 (voltage Va) and a low-voltage-side power supply 12 (voltage Vb) are connected to the operational amplifier OP1. The output unit 20 comprises an operational amplifier OP2. The operational amplifier OP2 comprises an input terminal, an inversion input terminal and an output terminal, and constitutes a voltage follower. A high-voltage-side power supply 21 (voltage Va') and a low-voltage-side power supply 22 (voltage Vb') are connected to the operational amplifier OP2. In the voltage generating circuit, an input voltage (reference voltage) $V_{IN}$ is voltage-converted and then further impedance-converted so that an output voltage $V_{OUT}$ is generated through collaboration between the voltage converter 10 and the output unit 20.

An operational of the voltage generating circuit according to the present preferred embodiment thus constituted is described below. Assume that the following values are respectively set as follows: Va=5V; Vb=0V; Va'=6V; Vb'=1.0V; $V_{IN}$=0.97V; R1=100 kΩ; and R2=400 kΩ. For the convenience of description, it is temporarily assumed that Va'=Va=5V, and Vb'=Vb=0V. Vc denotes a ground level.

First is described a state where the input voltage $V_{IN}$=0.97V is inputted to the input terminal of the voltage generating circuit. The voltage converter 10 converts the input voltage $V_{IN}$ into a higher voltage. An output voltage of the voltage converter 10, which the non-inversion amplifier (operational amplifier OP1, resistances R1 and R2), is $V_{IN}$×(1+R2/R1)=4.85V.

Output loads of the operational amplifier OP1 includes an input capacitance of the operational amplifier OP1, an input bias current of the operational amplifier OP1 and parallel resistances (resistance R1 and R2), which are substantially pF-order capacitance and approximately 10µA current. In the case of the output loads of the described level, any voltages below an offset voltage (approximately a few mV–ten-odd mV) can be easily outputted from the operational amplifier OP1 when the following measures are taken:

The output transistor of the operational amplifier OP1 is designed such that it can deal with a load three to ten times as large as the load mentioned earlier; and The differential amplifying circuit of the operational amplifier OP1 is configured to deal with the load described earlier.

The description is further made referring to the state where the output voltage of the voltage converter 10 is 4.85V. The output voltage of the operational amplifier OP1 (4.85V) is inputted from the output terminal of the operational amplifier OP1 to the input terminal of the operational amplifier OP2 in the output unit 20. The operational amplifier OP2 voltage-follows the inputted voltage to thereby output the output voltage of 4.85V from the output terminal thereof. In the output unit 20, an input of a source driver is an output load, and also, a liquid crystal element may be an output load in some instances. Therefore, the output load of at least a few nF—several tens of nF, and further, the output load of a few Ω—several tens of kΩ may be applied to the output unit 20. The voltage converter 10 is connected to the output unit 20 where such heavy loads are applied, and then, the voltage (4.85V) near the power supply voltage Va (=5.0V) is inputted to the output unit 20 from the voltage converter 10. Under such circumstances, it is not easy for the output unit 20 to output the input voltage (4.85V) at a high speed and a low impedance without generating any error. This can be understood when the output transistor of the operational amplifier OP2 is observed. Below is given a description.

It is assumed that an operational region of the output transistor of the operational amplifier OP2 is a saturation region. In the case where the operational region of the output transistor is a non-saturation region or an interrupting region, an offset voltage is generated in the output voltage, which results in a difference between the output voltages and the input voltage. Accordingly, it becomes difficult to keep the accuracy of the output voltage of the output unit 20 (accuracy in gray scale voltage) within its allowable error range (20-30 mV). An analog circuit, such as an operational amplifier, is designed based on the condition that it is operated in the saturation region. Unless the condition is met, a velocity response factor is deteriorated due to the above described generation of the offset voltage or the deterioration of frequency characteristics. However, it is difficult for the output transistor to be constantly operated in the saturation region. Further description is made as below.

In the case where the output transistor is MOSFET, it is known that its drain current $I_{DS}$ is as follows.

$$I_{DS}=(1/2) \cdot \mu \cdot COX \cdot (W/L) \cdot (V_{GS}-V_T)^2 \quad 1)$$

Wherein
µ: mobility
COX: gate oxide film thickness
W: channel width
L: channel length
$V_T$: threshold voltage
$V_{GS}$: gate-source voltage In the case where an operational region of a transistor is the saturation region, the following formula is satisfied.

$$0<(V_{GS}-V_T)<V_{DS} \quad 2)$$

The drain-source voltage $V_{DS}$ is a difference between the power supply voltage Va'(=5V) and the output voltage 4.85V, which is 0.15V in the present case. $(V_{GS}-V_T)$ can be calculated when the formula 1) is modified. However, the transistor will have a structure which is vulnerable to process variability and the like, unless $(V_{GS}-V_T)$ is set to approximately 0.2V because the drain current $I_{DS}$ has to vary widely when the threshold voltage $V_T$ of the MOS transistor varies or when the process variability occurs in the channel width W or the channel length L. However, when the operational state $(V_{GS}-V_T)>0.2V)$, which allows the transistor to stably operate in the saturation region, is set with the drain-source voltage $V_{DS}$ at 0.15 V, the formula 2) cannot be satisfied. So far were described the details of why it was difficult for the conventional amplifier to drive the power supply voltage Va and the voltage range including the voltages near the power supply voltage.

Therefore, in the present preferred embodiment, Va' (=6V), which is different to the voltage Va (=5V) of the high-voltage-side power supply 11 in the operational amplifier OP1, is set as the voltage Va' of the high-voltage-side power supply 21 in the operational amplifier OP2. Accordingly, the drain-source voltage $V_{DS}$ in the output transistor of the operational amplifier OP2 is 1.15 V, and the operational amplifier OP2 can be operated in a sufficiently stable saturation region. As a result, a higher speed and a lower impedance can be realized. In order to achieve that, it is also important that the voltage of the high-voltage-side power supply 11 in the operational amplifier OP1 is Va (=5V). When the voltage of the high-voltage-side power supply 21 in the operational amplifier OP2 is Va' (=6V), there is a concern that a voltage which is at least the power supply voltage Va (=5V) may be generated in the output. Such an overly large voltage is generated by the offset voltage or the activation of the operational amplifier OP1, or the overshoot at the time of an input response. The output of at least the power supply voltage Va (=5V) does not necessarily cause a problem at all times. However, the generation of the output voltages exceeding the power supply voltage Va may lead to the breakdown of liquid crystal elements and the deterioration of reliability depending on the breakdown strength of the elements.

In the present preferred embodiment, therefore, the relationship between the voltage Va of the high-voltage-side power supply 11 in the operational amplifier OP1 and the voltage Va' of the high-voltage-side power supply 21 in the operational amplifier OP2 is set to Va<Va' (Va=5V, Va'=6V in the foregoing example) as shown in FIG. 2. Accordingly, a voltage which is at most the power supply voltage Va (=5V) is inputted to the operational amplifier OP2. The operational amplifier OP2, which voltage-follows the input voltage, outputs the voltage equal to the input voltage. As a result, the output of the operational amplifier OP2 can be kept not to exceed the voltage Va (=5V) of the first high-voltage-side power supply 11. As a step to be taken at the time of the activation, the voltage Vb' of the second low-voltage-side power supply 22 needs only to be set to an initial value when the operational amplifier OP2 is in the OFF state (non-operational state).

In liquid crystal drives available in recent years, there is a trend that the voltage Va of the first high-voltage-side power supply 11 is reduced, and the power supply voltage Va is stepped up or stepped down to be used as a power supply of a gate driver and opposing electrodes. Therefore, the voltages of the gate driver and opposing electrodes may be used for the power supply voltage Va' of the second high-voltage-side power supply 21. Further, LOD (Low Drop Out Regulator) may be provided so that the voltage Va' of the second high-voltage-side power supply 21 is generated.

In the case where only voltages near the power supply voltage Va of the first high-voltage-side power supply 11 are necessary for the output, the voltage Vb is prepared in place of the voltage Vb' of the second low-voltage-side power supply 22 in the operational amplifier OP2 and supplied to the low-voltage-side power supply 22 in the operational amplifier OP2, so that the dielectric breakdown voltage of the transistor in the operational amplifier OP2 becomes equal to that of the transistor in the operational amplifier OP1. FIG. 3 is a circuit diagram wherein the constitution described in this section is actively utilized.

In the case where only voltages which are at least the power supply voltage Va/2 are necessary for the output, Va/2 is newly set as the voltage Vb' of the low-voltage-side power supply 22, in which case the new voltage Vb' of the low-voltage-side power supply 22 is 2.5V because Vb=0V as originally set. Then, the dielectric breakdown voltage of the transistor constituting the output unit 20 may be as small as 2.5V, which is the half of the dielectric breakdown voltage of the transistor constituting the voltage converter 10. When the dielectric breakdown voltage of the transistor can be reduced to half, substantially twofold-fivefold improvement can be realized in the capacity of the transistor. As a result, a higher speed and a lower impedance can be realized.

MODIFIED EMBODIMENT 1 OF THE PREFERRED EMBODIMENT 1

In the case where the voltages near the power supply voltage Vb are generated contrary to the description so far, the power supply voltage Vb' should be set to about −1.0V, and the power supply voltage Va' should be set to 4.0V.

In the case where the output voltage range is narrow or a negative output voltage is generated, an inversion amplifier may be constituted by the operational amplifier OP1 and the resistances R1 and R2 constituting the voltage converter 10. In this constitution, the resistance R1 is connected to between the input terminal of the operational amplifier OP1 to which the input voltage $V_{IN}$ is inputted, and the inversion input terminal (−) of the operational amplifier OP1, and the resistance R2 is connected to between the inversion input terminal (−) and the output terminal of the operational amplifier OP1.

Furthermore, when the voltage Va is used as both of the voltage of the high-voltage-side power supply 11 in the voltage converter 10 and the voltage of the high-voltage-side power supply 21 in the output unit 20, and the voltage of the low-voltage-side power supply 12 in the voltage converter 10 is set to the voltage Vb, and the voltage of the low-voltage-side power supply 22 in the output unit 20 is set to the voltage Vb', the output unit 20 can speedily output the power supply voltage Vb and the voltages near the power supply voltage Vb at a low impedance without generating any error.

MODIFIED EMBODIMENT 2 OF THE PREFERRED EMBODIMENT 1

Next, another modified embodiment, wherein LDO (Low Drop Out Regulator) is provided, is described. In FIG. 4, the same reference symbols as those shown in FIGS. 1, 2 and 3 denote the same components; therefore, those components will not be described in detail. A voltage generating circuit according to the present modified embodiment outputs a voltage while taking either of the following two ways: the way in which the current is discharged from the output; and the way in which the current is sucked into the output.

A reference symbol OP3 shown in the voltage converter 10 denotes a differential amplifying circuit. The high-voltage-side power supply 11 of the differential amplifying circuit OP3 is the power supply voltage Va, and the low-voltage-side power supply 12 thereof is the power supply voltage Vb. An output unit 20 comprises a drive transistor Q1 and resistances R3 and R4. Vc denotes a ground level. An output voltage $V_{OUT}$ is obtained by an input voltage $V_{IN} \times (1+R4/R3)$, and any voltages suitable for driving the liquid crystal can be set in a programmable way when the resistances R3 and R4 are made variable. FIG. 4 is a circuit configuration illustrating a constitution wherein the current is discharged. In the case where the high-voltage-side power supplies 11 and 21 and the low-voltage-side power supplies 12 and 22 in the voltage converter 10 and the output unit 20 are reversely connected, and the drain and the source of the drive transistor Q1 are reversely connected in the illustrated circuit configuration, a circuit configuration where in the current is sucked can be obtained. By doing so, when the power supply voltage Va' is set in the high-voltage-side power supply 21 of the output unit 20, the power supply voltage Va and voltages near the power supply voltage Va can be outputted.

Figure 5:
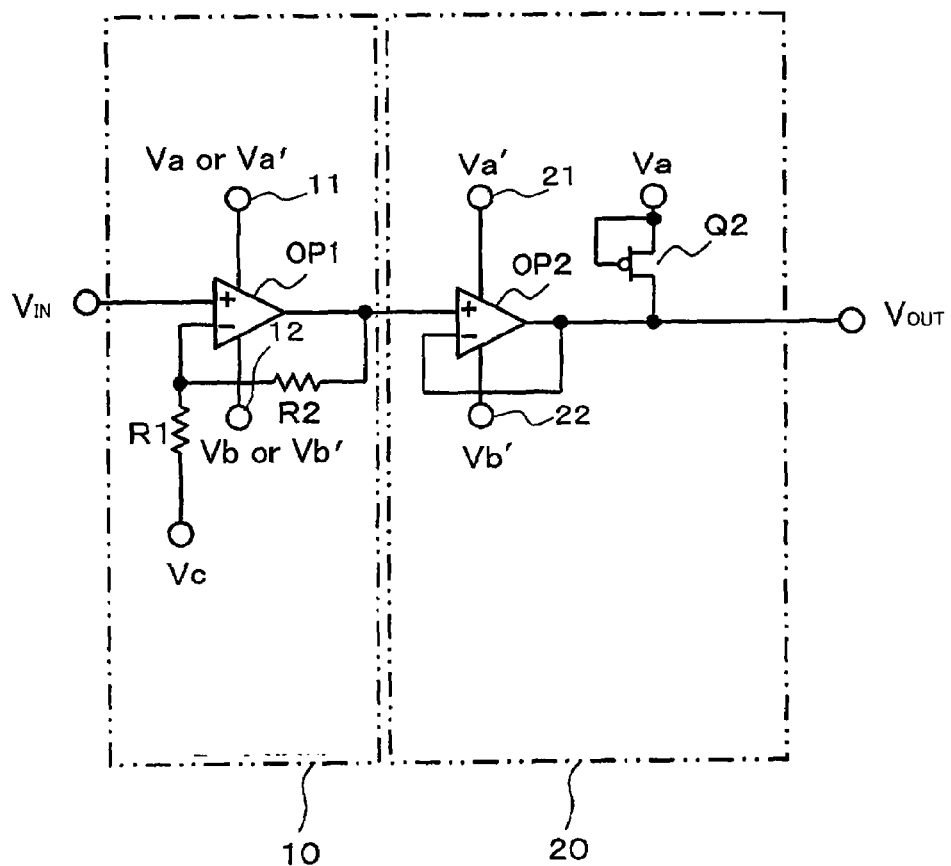
FIG. 5 is a circuit diagram illustrating a constitution of a voltage generating circuit according to a preferred embodiment 2 of the present invention.

Next is described the view that no problems are caused in terms of characteristics of the voltage generating circuit when the dielectric breakdown voltage of the voltage converter 10 is |Va−Vb|. The voltage generated between the resistances R3 and R4 during the operational of the voltage generating converter 10, which is decided by the imaginary short of the differential amplifying circuit OP3 in the voltage converter 10, becomes equal to the input voltage $V_{IN}$. Therefore, there is no problem in the dielectric breakdown voltage in the steady state (during the operation). At the time of the activation, however, the voltage generated between the resistances R3 and R4 has not been decided yet, which makes it necessary to take measures against the breakdown voltage. As an example of the measures, such a constitution that an off transistor (not shown) is provided below the resistance R4, and the drive transistor Q1 is turned on while the output unit 20 is in the OFF state may be adopted. Accordingly, the voltage generated between the resistances R3 and R4 results in a voltage obtained when the high-voltage-side power supply voltage Va' is divided between the resistances R3 and R4. When the divided voltage is at most the power supply voltage Va, no problem related to the dielectric breakdown voltage occur in many cases. The input voltage of the drive transistor Q1 also results in the voltage divided by the resistance R3 and R4, which causes no problem in the dielectric breakdown voltage of the drive transistor Q1. FIG. 5 shows a constitution which adopts the case that the output voltage of the output unit 20 does not exceed Va. In the constitution illustrated in FIG. 5, a breakdown voltage control transistor Q2 is further provided at an output end of the output unit 20. As a result, a voltage generating circuit characterized as follows can be realized.

The voltage can be outputted at a high speed and a low impedance.

The generation of the output voltage exceeding the voltage (Va+$V_F$) can be surely prevented ($V_F$ is a forward saturation voltage of the transistor).

The circuit area can be reduced.

So far was described the operation according to the preferred embodiment 1 in the case where a Pch transistor is used as the drive transistor Q1. Below is described an operation according to the preferred embodiment 1 in the case where an Nch transistor is used as the drive transistor Q1.

MODIFIED EMBODIMENT 3 OF THE PREFERRED EMBODIMENT 1

In the case where an Nch transistor is used as the drive transistor Q1, the drive transistor Q1 outputs a voltage dropped from a gate voltage thereof by at least the threshold voltage $V_T$. The drive transistor Q1 can function as a source follower, and therefore, the impedance can be further reduced.

The high-voltage-side power supply 11 of the voltage converter 10 is set to the power supply voltage Va' in place of the power supply voltage Va shown in FIG. 4. At the time, the power supply voltage Va' is set as Va'=Va+$V_T$+α. The voltage $V_T$ is the threshold voltage of the drive transistor Q1 and added to the power supply voltage Va in order to operate the drive transistor Q1. The voltage α is a voltage obtained when a voltage of approximately 0.1-0.3 V is added to Vdsat obtained when the drive transistor Q1 outputs a maximum current, and added to the power supply voltage Va so that any voltages which are at least the power supply voltage Va are not outputted.

Thus constituted, the output voltage $V_{OUT}$ can be linearly controlled as far as the drive transistor Q1 is operated in the saturation region. The output voltage $V_{OUT}$ can be calculated as the input voltage $V_{IN}$×(1+R4/R3). Therefore, the output voltage $V_{OUT}$ can be outputted as a voltage suitable for the liquid crystal display when the resistance values of the resistances R3 and R4 are adjusted.

In the case where the drive transistor Q1 of the output unit 20 is the Nch transistor, the power supply voltage Va and the voltages near the power supply voltage Va can be outputted as the output voltage which does not exceed the power supply voltage Va (approximately 1.0V) by a large amount when the appropriate restricting conditions described earlier are given to the output voltage of the voltage converter 10 and the power supply voltage Va'. Further, such an output voltage can be outputted at a high speed and a low impedance.

In a manner similar to the other preferred embodiments, in the case where the output voltage range of the voltage generating circuit is higher than the power supply voltage Vb by at least a difference between the power supply voltage Va and the power supply voltage Va', the low-voltage-side power supply voltage Vb of the voltage converter 10 is set to Vb'. As a result, the breakdown voltage of the transistor can be reduced, the area and the output impedance can be reduced, and the response speed can be improved. The power supply voltage Vb' can be selected so as to satisfy the formula 2) to which the power supply voltage Vb' is assigned in place of the power supply voltage Vd. More specifically, the drain-source voltage $V_{DS}$ is a voltage obtained when a source voltage $V_s$ is subtracted from a drain voltage $V_d$ of the transistor ($V_{DS}=V_d-V_s$). In that case, the source voltage $V_s$=power supply voltage $V_b$, and the power supply voltage $V_d$=output voltage $V_{OUT}$. Therefore, to assign the power supply voltage Vb' to the formula 2) in place of the power supply voltage $V_d$ is to assign the drain-source voltage ($V_{DS}=V_{OUT}-V_b$).

The constitution of the operational amplifier OP1 is not particularly illustrated in the drawings or described in detail in this specification. It is needless to say that the effect exerted by the voltage generating circuit according to the present preferred embodiment is not undermined in the case where a two-stage amplifying circuit, a three-stage amplifying circuit, a rail-to-rail operational amplifier, or the like is adopted as the operational amplifier OP1.

PREFERRED EMBODIMENT 2

FIG. 5 is a circuit diagram illustrating a constitution of a voltage generating circuit according to a preferred embodiment 2 of the present invention. In FIG. 5, the same reference symbols as those shown in FIGS. 1-3 denote the same components; therefore, these components will not be described in detail. In the voltage generating circuit according to the present preferred embodiment, either Va or Va' may be set as the voltage of the high-voltage-side power supply 11 in the operational amplifier OP1. The output terminal of the output unit 20 comprises a breakdown voltage control transistor Q2. A Pch transistor constitutes the breakdown voltage control transistor Q2, wherein a source and a gate thereof are short-circuited relative to each other and then connected to the power supply voltage Va, and a drain thereof is connected to the output terminal of the operational amplifier OP2.

Below is described an operation performed when the power supply voltage Va or the voltages near the power supply voltage Va are outputted from the voltage converter 10. In the case where the voltage of the high-voltage-side power supply 11 in the voltage converter 10 is Va, the applied load is light as described in the preferred embodiment 1. Therefore, voltages up to a level of approximately (Va−50 mV) can be outputted. When the power supply voltage Va is desired to be outputted, the output transistor is completely turned on. In that case, the power supply voltage Vb should be given to the gate voltage, and the transistor of the output unit 20 on the side where the current is sucked in should be turned off. These operations are realized when the resistances R1 and R2 are made variable or the output transistor is controlled depending on the liquid crystal driving voltage.

In the case where a voltage that is continuously variable until it reaches the power supply voltage Va is desired to be generated, the voltage of the high-voltage-side power supply 11 in the voltage converter 10 is set to the voltage Va' in place of the voltage Va. The reason for that is given below. In the case where the voltage of the high-voltage-side power supply 11 is Va, despite the light load, it is very difficult for the output to be accurate because the voltages near the voltage Va (Va−5 mV, or the like) are within the non-saturation region of the output transistor. Therefore, in the present preferred embodiment, the output voltage range of the power supply voltage Va' is extended up to voltages near the power supply voltage Va'. As a result, the voltages near the power supply voltage Va can be accurately outputted when the resistance values of the resistances R1 and R2 are adjusted.

Then, the output unit 20 inputs thereto the output voltage of the voltage converter 20, voltage-follows the inputted voltage and outputs the resultant voltage. At the time, the breakdown voltage control transistor Q2 limits the voltage. More specifically, any voltage which is at least (Va'−$V_F$) is not outputted from the output unit 20 when the saturation voltage $V_F$ of the breakdown voltage control register Q2 is limited to 0.3-0.7V. In FIG. 5, the Pch MOS transistor in the OFF state in which the gate and source terminals are connected to each constitutes the breakdown voltage control transistor Q2. A bipolar transistor in which an emitter and a base are short-circuited relative to each other, a diode, or an Nch MOS transistor may similarly constitute the breakdown voltage control transistor Q2. Thus constituted, the power supply voltage Va and the voltages near the power supply voltage Va can be outputted at a high speed and a low impedance. Further, the generation of the output voltages exceeding the voltage (Va+V$_F$) can be reliably prevented.

MODIFIED EMBODIMENT OF THE PREFERRED EMBODIMENT 2

Figure 6:
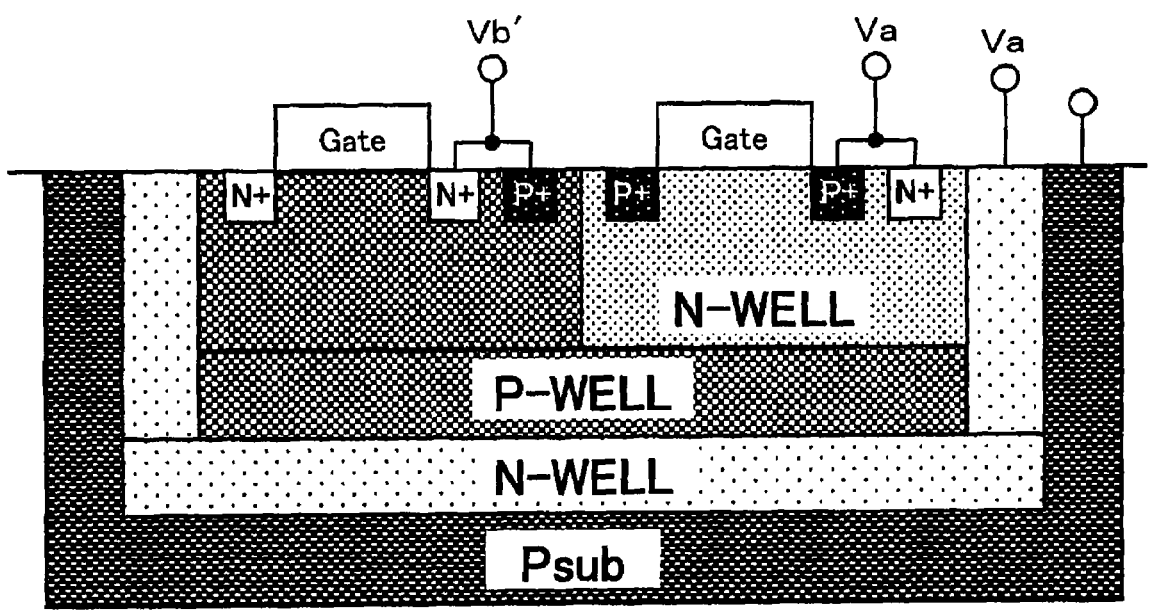
FIG. 6 is a sectional view illustrating a breakdown voltage control transistor according to the preferred embodiment 2.

The breakdown voltage control transistor Q2 in FIG. 6 illustrates a voltage supply method in the case of a three-well structure. As described earlier, in a liquid crystal driver available in recent years, voltages of a source, gate and opposing electrode are realized in one chip. In such a constitution, wherein various voltages (positive voltage, negative voltage, high voltage, low voltage and the like) become necessary, processes of the three-well structure as shown in FIG. 6 or any structures similar thereto are often adopted. In that case, voltages near (Va+V$_F$) may be applied to the drain terminal (P$^+$) of the breakdown voltage control transistor Q2, as a result of which a voltage of an N well can also be at least Va. If a voltage of a P well is the power supply voltage Vb, dielectric breakdown voltages which are at least |Va−Vb| become necessary. As a solution, a transistor having a dielectric breakdown voltage higher than those of the transistors constituting the voltage converter 10 and the output unit 20 may be adopted; however, in that case, there are at least two problems as below.

1) In the case where the breakdown voltage control transistor Q2 also serves as an ESD (Electro Static Discharge) protective element (serving as a protecting element against static discharge), a protective capacity thereof against the static discharge is deteriorated when the dielectric breakdown voltage of the breakdown voltage control transistor Q2 becomes higher than those of the transistors inside the voltage generating circuit. As a result, the internal transistors are broken down before the protection starts.

2) A transistor whose breakdown voltage is high has a large element size, which increases an element area. Further, when the element is enlarged in order to solve the problem in 1), the element size becomes even larger.

In the case where the output voltage range is near Va/2−Va, therefore, the power supply voltage Vb' is applied to the P well of the breakdown voltage control transistor Q2 as shown in FIG. 6. Accordingly, it becomes unnecessary to increase the breakdown voltage of the breakdown voltage control transistor Q2. Further, the breakdown voltage control transistor Q2 can also serve as the protective element, and the effect of the area reduction can be accordingly expected.

The power supply voltages Va' and Vb' are selected such that the following formula can be satisfied and requirements of the output voltage range can be met.

$$|Va-Vb| >= |Va'-Vb'| \quad (3)$$

As a result, the voltage generating circuit capable of speedily outputting the voltages near the power supply voltage Va at a low impedance can be realized in a relatively small circuit area.

PREFERRED EMBODIMENT 7

Figure 7:
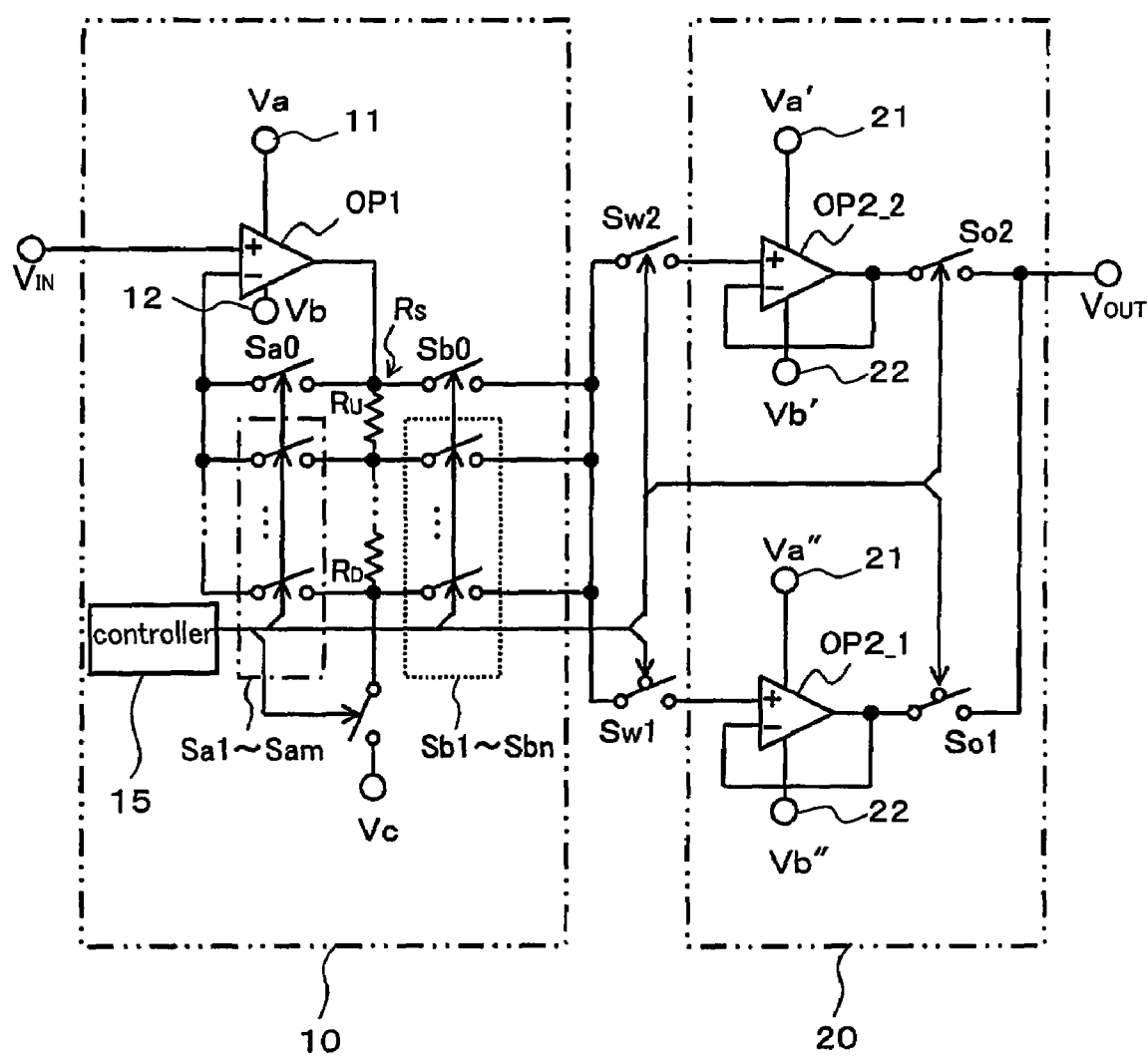
FIG. 7 is a circuit diagram illustrating a constitution of a voltage generating circuit according to a preferred embodiment 3 of the present invention.

FIG. 7 is a circuit diagram illustrating a constitution of a voltage generating circuit according to a preferred embodiment 3 of the present invention. In FIG. 7, the same reference symbols as those shown in FIGS. 1-3 denote the same components; therefore, these components will not be described in detail. In the voltage generating circuit according to the present preferred embodiment, the whole range of voltages from the voltage Va to the voltage Vb are outputted.

In FIG. 7, a reference numeral 15 denotes a controller which controls the voltage suitable for the liquid crystal display. The controller 15 controls the voltage based on liquid crystal display data transmitted from a controller of a liquid crystal driver or a microcomputer. The controller 15 not only controls a voltage value suitable for the liquid crystal display but also controls the ON and OFF operations of the voltage generating circuit. Further, m number of resistance selecting switches Sa1-Sam and a short-circuit switch Sa0 select whether the operational amplifier OP1 functions as the voltage follower or the non-inversion amplifier (or inversion amplifier). When the operational amplifier OP1 operates as the non-inversion amplifier (or inversion amplifier), the output voltage is decided based on a resistance-dividing ratio determined by one resistance selecting switch selected from among the resistance selecting switches Sa1-Sam.

When the operational amplifier OP1 operates as the inversion amplifier, the resistances are separately provided in the following manners: a resistance between the terminal to which the input voltage V$_{IN}$ is inputted and the inversion input terminal (−), and a resistance between the inversion input terminal (−) and the output terminal. The ON resistances of the resistance selecting switches Sa1-Sam are designed to be sufficiently smaller than the resistances (smaller by at least two or three orders of magnitude).

N number of voltage selecting switches Sb1-Sbn are provided to divide the output voltage value of the operational amplifier OP1 by n, and output the divided voltage. Sb0 is a short-circuit switch, and Sw1 and Sw2 are transmission selecting switches which select whether the voltage is transmitted or not transmitted from the voltage converter 10 to the output unit 20.

When the resistances switches Sa1-Sam are turned on and off based on a control signal from the controller 15, a variable resistance R$_S$ for voltage division is divided into a voltage-dividing resistance R$_D$ on the ground-level-Vc side (DOWN side), and a voltage-dividing resistance R$_U$ on the output side (UP side) of the voltage converter 10. Therefore, the variable resistance R$_S$=voltage-dividing resistance R$_D$+voltage-dividing resistance R$_U$. Because the resistance values R$_U$ and R$_D$ can be optionally set based on the control signal, the resistance R$_S$ is called a variable resistance. The variable resistance R$_S$ for voltage division is described on the basis of the m number fixed resistances having an equal resistance value. The m number of fixed resistances may respectively have different resistance values in the case of the non-inversion amplifier (inversion amplifier) or in view of γ characteristics of the liquid crystal display device.

An operation of the voltage generating circuit according to the present preferred embodiment is described. The description is given referring to two cases depending on the voltage range. In order to help the operation be easily understood, assume that the power supply voltage Va=5.0V, the power supply voltage Vb=0V, and the input voltage V$_{IN}$=1.0V.

Below are described the operations of the voltage generating circuit 10 in the case of 1) and 2) shown below.

1) The operation in the case where a voltage which is at most the power supply voltage Va/2 is outputted as the output voltage.

2) The operation in the case where a voltage exceeding the power supply voltage Va/2 is outputted as the output voltage.

First, the operation of the voltage generating circuit 10 in the case of 1) is described. The operation in the case of 1) is further divided into two operations.

1-1. The operation in the case where a voltage which is at most the input voltage $V_{IN}$ and at least the ground voltage is desired to be outputted as the output voltage based on the liquid crystal display data.

1-2. The operation in the case where a voltage exceeding the input voltage $V_{IN}$ or a negative voltage is desired to be outputted as the output voltage based on the liquid crystal display data.

First, the operation of the voltage converter 10 in the case of 1-1. is described. When the input voltage $V_{IN}$ itself is desired to be outputted, the short-circuit switch Sa0 is turned on. As a result, the operational amplifier OP1 acts as the voltage follower, and the input voltage $V_{IN}$ is outputted from the voltage converter 10.

Next, the operation in the case where it is desired to output a voltage below the input voltage $V_{IN}$. In this case, the short-circuit switch Sa0 is turned on, and the input voltage $V_{IN}$ is voltage-followed by the operational amplifier OP1 and then divided by the resistance $R_S$. Further, the divided voltage is selected by the voltage selecting switches Sb2-Sbn (except for the voltage selecting switch Sb1) so that the resistance-divided voltage is outputted. At the time, the output voltage is $V_{IN} \times R_U/(R_U+R_D)$. When it is desired to output 0V (power supply voltage Vb), 0V should be selected by the voltage selecting switch Sb1. As a result of the operations thus described, a whole range of voltages from 0V-$V_{IN}$ can be selectively outputted.

The operation of the voltage converter 10 in the case of 1-2. is described below. When it is desired to output a voltage exceeding the input voltage $V_{IN}$, the operational amplifier OP1 is caused to serve as the non-inversion amplifier. When it is desirable to output the negative voltage, the operational amplifier OP1 serves as the inversion amplifier. FIG. 7 shows that the operational amplifier OP1 functions as the non-inversion amplifier. In the case where the inversion amplifier is used, the resistance $R_D$ is connected to between the terminal to which the input voltage $V_{IN}$ is applied and the inversion input terminal (−) of the operational amplifier OP1, and a switch (not shown) is inserted between the output terminal and the inversion input terminal (−) of the operational amplifier. The provided switch turns on and off a connecting point of the resistance $R_U$.

Below is described in further detail the operation performed when a voltage exceeding the input voltage $V_{IN}$ is desired to be outputted in the case where the operational amplifier OP1 is used as the non-inversion amplifier. The resistance $R_U$ is connected to between the output terminal and the inversion input terminal (−) of the operational amplifier OP1, and the resistance $R_D$ is connected to between the connecting point of the resistance $R_U$ and the ground level Vc. Therefore, the output voltage of the operational amplifier OP1 is the input voltage $V_{IN} \times (1+R_U/R_D)$.

Accordingly, a whole range of voltages from $V_{IN}$ to Va/2 can be selectively outputted in accordance with the control. Voltages up to the power supply voltage Va can be outputted in an actual operation, but it will be described later. Thus, the voltages from 0V to Va/2 can be generated based on the control operation.

The operation of the output unit 20 in the case of 1), wherein a voltage which is at most the power supply voltage Va/2 is outputted as the output voltage, is described. When it is desired to output a voltage which is at most the power supply voltage Va/2, the controller 15 turns on the transmission selecting switch Sw1 and the output selecting switch So1, and thereby turns on a lower-side operational amplifier OP2_1 (operating state), and further, turns off the transmission selecting switch Sw2 and the output selecting switch So2, and thereby turns off an upper-side operational amplifier OP2_2 (non-operating state). Because of those control operations, the output of the voltage converter 10 is supplied to the lower-side operational amplifier OP2_1. The lower-side operational amplifier OP2_1 is operated in the voltage-following manner and outputs the inputted voltage via the output selecting switch So1.

Focusing on the power supply of the lower-side operational amplifier OP2_1, the power supply voltages are Va″, Vb″. The voltages satisfying Va>Va″>Va/2+φ, and Vb>Vb″ are selected as the power supply voltages. As φ, approximately 0.2-0.3 is set in the case where the lower-side amplifier OP2_1 is a source ground circuit, and approximately 0.6-1.0V is set in case where the lower-side operational amplifier OP2_1 is a source follower circuit. It is assumed that the power supply voltage Va=5.0V, the power supply voltage Vb=0V, the power supply voltage Va″=4.0V, and the power supply voltage Vb″=−1.0V are selected. In the case of the power supplies thus constituted, no problems occur in the amplification when 0V is inputted from the voltage converter 10. Further, voltages exceeding 0V can be amplified without any problem. As a result, the voltages 0V-Va/2 can be outputted at a high speed and a low impedance.

The operation of the output unit 20 in the case of 2), wherein a voltage exceeding the power supply voltage Va/2 is outputted as the output voltage, is described. The operation of the voltage converter 10 in this case is similar to the operation described in the case of 1-2., and the output voltage of the voltage converter 10 then is $V_{IN} \times (1+R_U/R_D)$.

When the power supply voltage Va is desired to be outputted, one of the following two control operations is selected.

Only the transistor connected to the terminal of the power supply voltage Va in the output transistor of the operational amplifier OP1 is turned on, and the other transistors in the operational amplifier OP1 are turned off; and the power supply voltage is selected by one of the resistance selecting switches Sa1-Sam.

At the time, the operation of the output unit 20 is contrary to the operation in the case of 1). More specifically, when a voltage exceeding the power supply voltage Va/2 is desired to be outputted, the controller 15 turns on the transmission selecting switch Sw2 and the output selecting switch So2, and thereby turns on the upper-side operational amplifier OP2_2 (operating state), and further, turns off the transmission selecting switch Sw1 and the output selecting switch So1, and thereby turns off the lower-side operational amplifier OP2_1 (non-operating state). Because of those control operations, the output of the voltage converter 10 is supplied to the upper-side operational amplifier OP2_2. As a result, the upper-side operational amplifier OP2_2 is operated in the voltage-following manner and outputs the output voltage via the output selecting switch So2.

Focusing on the power supply of the upper-side operational amplifier OP2_2, the power supply voltages are Va′, Vb′. The voltages satisfying Va>Va′, and Vb′>Vb+φ are selected as the power supply voltages.

It is assumed that the power supply voltage Va=5.0V, the power supply voltage Vb=0V, the power supply voltage Va′=6.0V, and the power supply voltage Vb′=1.0V are selected. In the case of the power supplies thus constituted, no problems occur in the amplification when the power supply voltage Va is inputted from the voltage converter 10. Also there are no problems in the amplification of the power supply voltage Va. As a result, the voltages Va/2-Va can be outputted at a high speed and a low impedance.

In the foregoing example, the six different power supplies in total are necessary. It is needless to say that the voltage generating circuit can be further reduced in size and more simply configured in the case where the power supply voltage Va" and the power supply voltage Vb' are shared.

As described, since the controller 15 controls the operational circuits and the transistors, the following effects which are very advantageous for driving the liquid crystal display device can be obtained.

Voltages in the entire range of the drive voltages (0V-Va) necessary for the liquid crystal display can be generated at a high speed and a low impedance without increasing the circuit area and current consumption.

The power supply voltage Va and the power supply voltage Vb can also be driven at a high speed with a high accuracy because the voltage generating circuit 10 decides the voltage range.

The output voltage is prevented from exceeding the power supply voltage Va and the power supply voltage Vb.

MODIFIED EMBODIMENT OF THE PREFERRED EMBODIMENT 3

Figure 8:
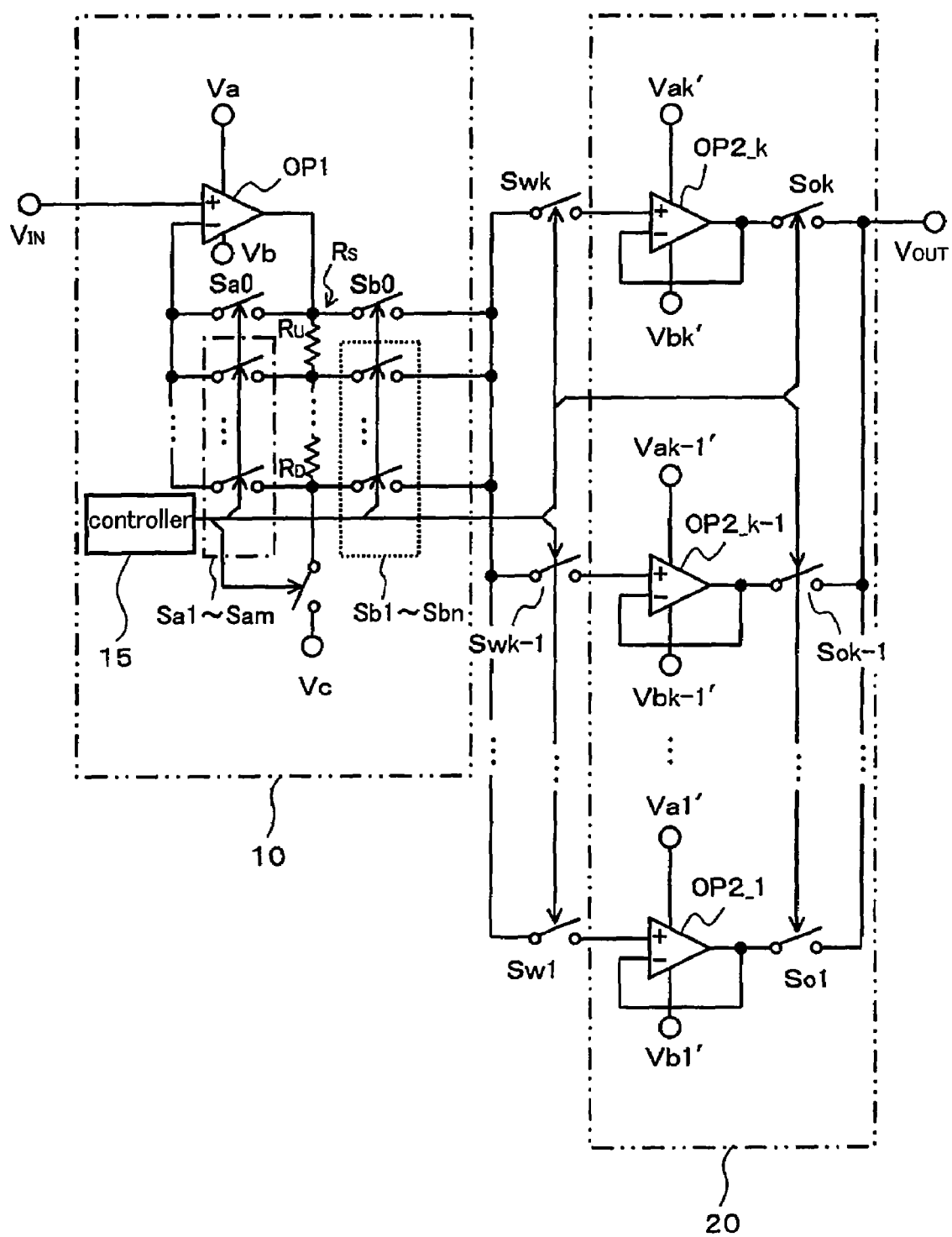
FIG. 8 is a circuit diagram illustrating a constitution of a voltage generating circuit according to a modified embodiment of the preferred embodiment 3.
Figure 9:
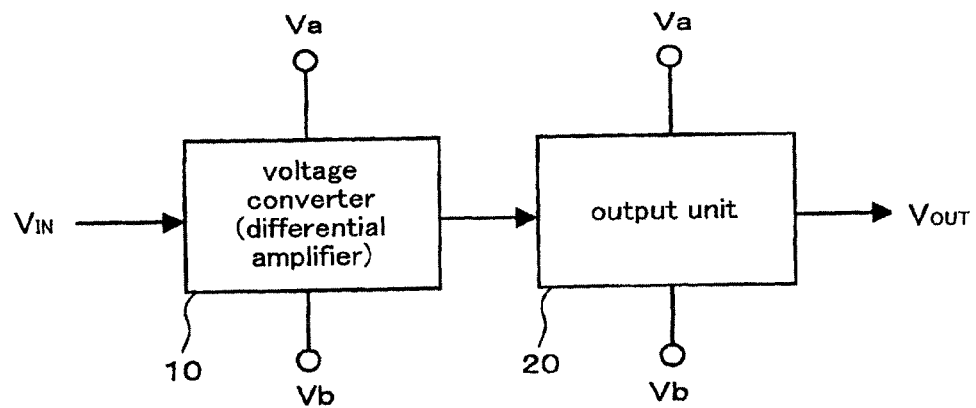
FIG. 9 is a drawing schematically illustrating a voltage generating circuit according to a conventional technology.
Figure 10:
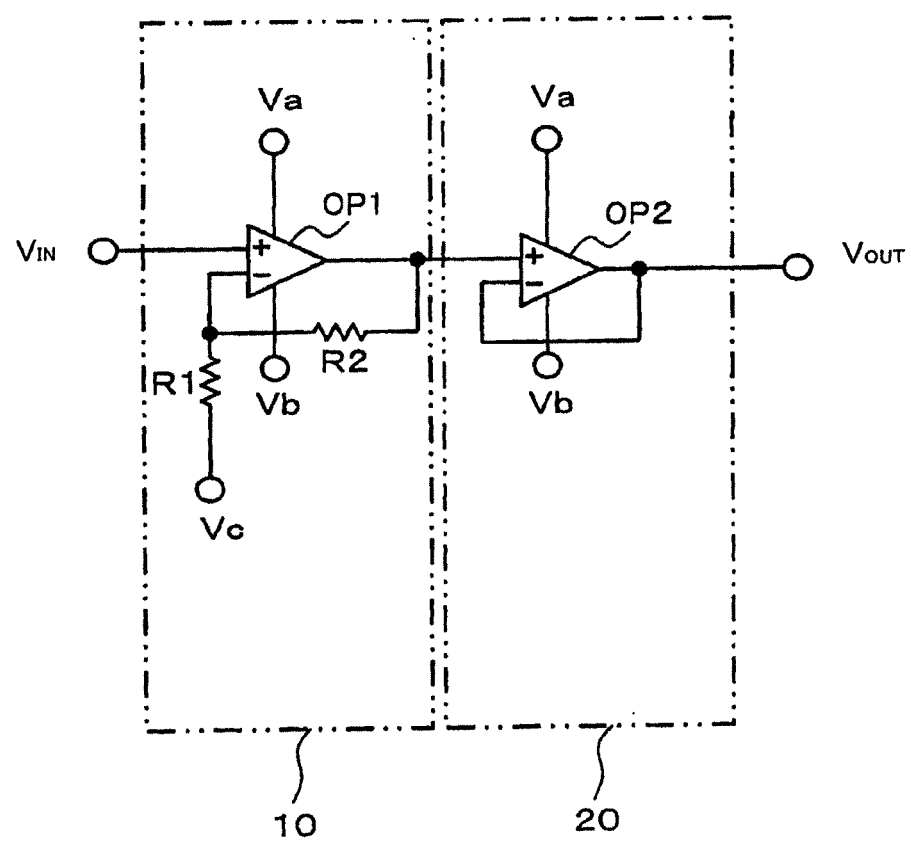
FIG. 10 is a circuit diagram illustrating the constitution of the voltage generating circuit according to a conventional technology.

In this modified embodiment, k number (k is a natural number which is at least one) of operational amplifiers OP2_1-OP2_k constitute the output unit 20 as shown in FIG. 8. k number of transmission selecting switches Sw1-Swk and k number of output selecting switches So1-Sok are respectively connected to between the output unit 20 and the output of the voltage converter 10. The output selecting switches So1-Sok select whether or not the outputs of the k number of operational amplifiers OP2_1-OP2_k are outputted, respectively.

In liquid crystal drivers in recent years, there is a trend that a RAM, controller, source driver and power supply circuit are mounted on one chip, wherein various breakdown voltage transistors and breakdown voltage power supplies are often further included. FIG. 8 illustrates a constitution which actively utilizes the trend, wherein the breakdown voltage transistors and breakdown voltage power supplies which are necessary are separately provided.

It is assumed that four different power supplies are provided (q=4), and respective power supply voltages are called $V_{HH}$, $V_H$, $V_L$, and $V_{LL}$ in the order of higher voltages, and further, three (k=3) operational amplifiers, which are provided between these power supplies, is provided to constitute the voltage converter 10. More specifically, the operational amplifier operated by the power supply voltages $V_{LL}$ and $V_L$ is referred to as OP2_1, the operational amplifier operated by the power supply voltages $V_L$ and $V_H$ is referred to as OP2_2, and the operational amplifier operated by the power supply voltages $V_H$ and $V_{HH}$ is referred to as OP2_3.

In the constitution, an element having a dielectric breakdown voltage enough for a voltage difference between the power supply voltages $V_{LL}$ and $V_L$ can constitute the operational amplifier OP2_1, an element having a dielectric breakdown voltage enough for a voltage difference between the power supply voltages $V_L$ and $V_H$ can constitute the operational amplifier OP2_2, and an element having a dielectric breakdown voltage enough for a voltage difference between the power supply voltages $V_H$ and $V_{HH}$ can constitute the operational amplifier OP2_3. This indicates that the elements having the dielectric breakdown voltage lower than that of the voltage converter 10 can constitute the components other than the transmission selecting switches Sw1-Sw3 and the output selecting switches So1-So3. Then, the power supplies can be separated into three divisions in this case, which can reduce the size of the power supplies of the operational amplifiers to ⅓, and further reduce the dielectric breakdown voltages thereof to approximately ⅓. Therefore, the output voltage can be outputted at a high speed and a low impedance. As a result, the characteristics can be improved such that the dielectric breakdown voltage is reduced to ½, the area occupied by the circuits is reduced to ¼, and the voltage output speed which is four times as high can be obtained.

The reduction of the breakdown voltage contributes to the area reduction and the improvement of performance. It is expected that the liquid crystal driver will be provided with an increasing number of functions, and the number of the power supplies and the number of the transistors having different dielectric breakdown voltages are increased. Therefore, the characteristics can be further improved and the area reduction can be achieved at the same time when the number of the power supplies q and the number of the operational amplifies k, which are shown in FIG. 8, are adjusted or increased.

In FIG. 8, it is assumed that the voltage having a load connected to the output is $V_L$. The range of the voltage $V_L$ can be set by the dielectric breakdown voltage of the voltage converter 10. Assume that the voltage VL is equal to the power supply voltage Va at a time point t1 based on the liquid crystal pixel data. At that time, the output voltage of the operational amplifiers OP2_1-OP2_3 will exceed the dielectric breakdown voltage thereof in the case where the breakdown voltages of the operational amplifiers OP2_1-OP2_3 are reduced as described earlier.

Below is described an operation to be performed in order to prevent such an inconvenience related to the dielectric breakdown voltage. Though not shown, assume that switches connected to the power supplies of the operational amplifiers OP2_1-OP2_3 are provided on the output side of the operational amplifiers OP2_1-OP2_3.

Below are described steps to be taken in the case where the power supply voltage Va was outputted at a time point t1 and it is desired to output a voltage based on the liquid crystal pixel data (any of the voltages between the power supply voltages $V_{LL}$ and $V_L$) from the operational amplifier OP2_1 at the next time point t2.

When the power supply voltage Va was outputted at the time point t1 and the transmission selecting switch Sw1 is turned on at the next time point t2, the output voltage of the operational amplifier OP2_1 exceeds its dielectric breakdown voltage. However, the operational amplifier OP2_1 outputs the power supply voltage $V_{LL}$ or $V_L$, or any of the voltages therebetween at a time point t1' preceding the time point t2. Then, the transmission selecting switch Sw1 is turned on. By doing so, the voltage of the output unit 20 is caused to converge on the power supply voltage $V_{LL}$ or $V_L$, or any of the voltages therebetween, and the operational amplifier OP2_1 is thereafter operated. As a result, the output voltage of the voltage generating circuit can stay within the range of its dielectric breakdown voltages.

Thus operated based on these steps, the dielectric breakdown voltage reduction can still be attained while the dielectric breakdown voltages of the elements constituting the operational amplifiers OP2_1-OP2_3 are certainly maintained. Further, as far as the impedance of the power supply is low enough, the effect of accelerating the convergence time can be expected. In a similar manner, in the operational amplifier OP2_1, an initial value used when the power supply is OFF or turned on is set to the power supply voltage $V_{LL}$ or $V_L$, or any of the voltages therebetween, and the other operational amplifiers are similarly set. As a result, the dielectric breakdown voltage reduction can be unfailingly achieved not only when the output voltage of the voltage generating circuit is changed but also in the transient state including the operating and non-operating states and the activation of the power supply.

The number of the power supplies q and the number of the operational amplifies k may be q=k−1 as in the preferred embodiment described earlier, or may be decided in accordance with the output voltage range or the dielectric breakdown voltages of the elements provided in a relevant semiconductor process after the number of the operational amplifiers is increased or decreased.

The preferred embodiments were described so far referring to the MOS transistor. It is needles to say that a bipolar transistor can constitute a similar circuit.

While there has been described what is at present considered to be preferred embodiments of this invention, it will be understood that various modifications may be made therein, and it is intended to cover in the appended claims all such modifications as fall within the true spirit and scope of this invention.

What is claimed is:

1. A voltage generating circuit comprising:
   a voltage converter for voltage-converting a reference voltage; and
   an output unit for impedance-converting the voltage outputted from the voltage converter,
   wherein a low-voltage-side power supply and a high-voltage-side power supply are connected to each of the voltage converter and the output unit, and
   a voltage level of the high-voltage-side power supply in the output unit is set to be higher than a voltage level of the high-voltage-side power supply in the voltage converter,
   wherein the voltage converter comprises:
   an operational amplifier provided with an input terminal to which the reference voltage is inputted and an output terminal;
   a variable resistance connected to the output terminal; and
   a controller for controlling the operational amplifier, and
   wherein the operational amplifier is configured to operate as a voltage follower in accordance with the control by the controller and thereby divides an output voltage thereof by the variable resistance and outputs the divided voltage.

2. The voltage generating circuit as claimed in claim 1, wherein the output unit further comprises a breakdown voltage controller for limiting the output voltage after the impedance conversion with reference to the voltage of the high-voltage-side power supply of the voltage converter.

3. The voltage generating circuit as claimed in claim 2, wherein the breakdown voltage controller is any of:
   a diode comprising a cathode to which the voltage of the high-voltage-side power supply in the voltage converter is supplied;
   a bipolar transistor comprising an emitter and a base, wherein the emitter and the base are short-circuited relative to each other, and the voltage of the high-voltage-side power supply in the voltage converter is supplied to the base; and
   an MOS transistor comprising a source and a gate, wherein the source and the gate are short-circuited relative to each other, and the voltage of the high-voltage-side power supply in the voltage converter is supplied to the gate.

4. The voltage generating circuit as claimed in claim 3, wherein the MOS transistor comprises an N well and a P well, wherein the voltage of the high-voltage-side power supply in the voltage converter is supplied to the N well, and the voltage of the low-voltage-side power supply in the output unit is supplied to the P well so that a dielectric breakdown voltage of the MOS transistor is set to be equal to or lower than the dielectric breakdown voltage of the voltage converter or the dielectric breakdown voltage of the output unit.

5. The voltage generating circuit as claimed in claim 1, wherein the variable resistance comprises:
   a plurality of resistances serially connected to each other; and
   resistance selecting switches provided between a connecting point at which the adjacent resistances are connected to each other and the output terminal,
   wherein the resistance selecting switches open and close in accordance with the control by the controller.

6. The voltage generating circuit as claimed in claim 1, wherein a differential amplifier constitutes the voltage converter.

7. The voltage generating circuit as claimed in claim 3, wherein a differential amplifier constitutes the voltage converter.

8. The voltage generating circuit as claimed in claim 1, wherein a source follower constitutes the output unit.

9. The voltage generating circuit as claimed in claim 3, wherein a source follower constitutes the output unit.

10. A voltage generating circuit comprising:
    a voltage converter for voltage-converting a reference voltage; and
    an output unit for impedance-converting the voltage outputted from the voltage converter,
    wherein a low-voltage-side power supply and a high-voltage-side power supply are connected to each of the voltage converter and the output unit,
    a voltage difference between the high-voltage-side power supply and the low-voltage-side power supply in the voltage converter is set to be smaller than a voltage difference between the high-voltage-side power supply and the low-voltage-side power supply in the output unit, and
    a dielectric breakdown voltage of the voltage converter is set to be smaller than a dielectric breakdown voltage of the output unit,
    wherein the voltage converter comprises:
    an operational amplifier provided with an input terminal to which the reference voltage is inputted and an output terminal;
    a variable resistance connected to the output terminal; and
    a controller for controlling the operational amplifier, and
    wherein the operational amplifier is configured to operate as a voltage follower in accordance with the control by the controller and thereby divides an output voltage thereof by the variable resistance and outputs the divided voltage.

11. The voltage generating circuit as claimed in claim 10, wherein the output unit further comprises a breakdown voltage controller for limiting the output voltage after the impedance conversion with reference to the voltage of the high-voltage-side power supply of the voltage converter.

12. The voltage generating circuit as claimed in claim 11, wherein the breakdown voltage controller is any of:
    a diode comprising a cathode to which the voltage of the high-voltage-side power supply in the voltage converter is supplied;

a bipolar transistor comprising an emitter and a base, wherein the emitter and the base are short-circuited relative to each other, and the voltage of the high-voltage-side power supply in the voltage converter is supplied to the base; and an MOS transistor comprising a source and a gate, wherein the source and the gate are short-circuited relative to each other, and the voltage of the high-voltage-side power supply in the voltage converter is supplied to the gate.

13. The voltage generating circuit as claimed in claim 12, wherein the MOS transistor comprises an N well and a P well, wherein the voltage of the high-voltage-side power supply in the voltage converter is supplied to the N well, and the voltage of the low-voltage-side power supply in the output unit is supplied to the P well so that a dielectric breakdown voltage of the MOS transistor is set to be equal to or lower than the dielectric breakdown voltage of the voltage converter or the dielectric breakdown voltage of the output unit.

14. The voltage generating circuit as claimed in claim 10, wherein the variable resistance comprises:

a plurality of resistances serially connected to each other; and resistance selecting switches provided between a connecting point at which the adjacent resistances are connected to each other and the output terminal, wherein the resistance selecting switches open and close in accordance with the control by the controller.

15. The voltage generating circuit as claimed in claim 10, wherein a differential amplifier constitutes the voltage converter.

16. The voltage generating circuit as claimed in claim 10, wherein a source follower constitutes the output unit.

17. A voltage generating circuit comprising:

a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, a voltage difference between the high-voltage-side power supply and the low-voltage-side power supply in the voltage converter is set to be higher than a voltage difference between the high-voltage-side power supply and the low-voltage-side power supply in the output unit, and a dielectric breakdown voltage of the voltage converter is set to be higher than a dielectric breakdown voltage of the output unit, wherein the voltage converter an operational amplifier provided with an input terminal to which the reference voltage is inputted and an output terminal;

a variable resistance connected to the output terminal; and a controller for controlling the operational amplifier, and wherein the operational amplifier is configured to operate as a voltage follower in accordance with the control by the controller and thereby divides an output voltage thereof by the variable resistance and outputs the divided voltage.

18. The voltage generating circuit as claimed in claim 17, wherein the output unit further comprises a breakdown voltage controller for limiting the output voltage after the impedance conversion with reference to the voltage of the high-voltage-side power supply of the voltage converter.

19. The voltage generating circuit as claimed in claim 18, wherein the breakdown voltage controller is any of:

a diode comprising a cathode to which the voltage of the high-voltage-side power supply in the voltage converter is supplied;

a bipolar transistor comprising an emitter and a base, wherein the emitter and the base are short-circuited relative to each other, and the voltage of the high-voltage-side power supply in the voltage converter is supplied to the base; and an MOS transistor comprising a source and a gate, wherein the source and the gate are short-circuited relative to each other, and the voltage of the high-voltage-side power supply in the voltage converter is supplied to the gate.

20. The voltage generating circuit as claimed in claim 19, wherein the MOS transistor comprises an N well and a P well, wherein the voltage of the high-voltage-side power supply in the voltage converter is supplied to the N well, and the voltage of the low-voltage-side power supply in the output unit is supplied to the P well so that a dielectric breakdown voltage of the MOS transistor is set to be equal to or lower than the dielectric breakdown voltage of the voltage converter or the dielectric breakdown voltage of the output unit.

21. The voltage generating circuit as claimed in claim 17, wherein the variable resistance comprises:

a plurality of resistances serially connected to each other; and resistance selecting switches provided between a connecting point at which the adjacent resistances are connected to each other and the output terminal, wherein the resistance selecting switches open and close in accordance with the control by the controller.

22. The voltage generating circuit as claimed in claim 17, wherein a differential amplifier constitutes the voltage converter.

23. The voltage generating circuit as claimed in claim 17, wherein a source follower constitutes the output unit.

24. A voltage generating circuit comprising:

a voltage converter for voltage-converting a reference voltage; and an output unit for impedance-converting the voltage outputted from the voltage converter, wherein a low-voltage-side power supply and a high-voltage-side power supply are connected to the voltage converter, the output unit comprises a plurality of first operational amplifiers, at least a low-voltage-side power supply and at least a high-voltage-side power supply are connected to the first operational amplifier, output voltages of the high-voltage-side power supply and the low-voltage-side power supply in the first operational amplifier are set to stay within a voltage difference range between a voltage higher than an output voltage of the high-voltage-side power supply in the voltage converter and a voltage lower than an output voltage of the low-voltage-side power supply in the voltage converter, and a dielectric breakdown voltage of the output unit is set to be equal to or lower than a dielectric breakdown voltage of the voltage converter, wherein the voltage converter comprises:

a second operational amplifier provided with an input terminal to which the reference voltage is inputted and an output terminal;

a variable resistance connected to the output terminal; and a controller for controlling the second operational amplifier, wherein the second operational amplifier is configured to operate as a voltage follower in accordance with the control by the controller and thereby divides an output voltage thereof by the variable resistance and outputs the divided voltage.

25. The voltage generating circuit as claimed in claim 24, further comprising output selecting switch for turning on and off outputs of the plurality of first operational amplifiers, wherein the output unit comprises an output terminal, the output selecting switch and the output terminal are connected to each other, and a dielectric breakdown voltage of the output selecting switch is set to be equal to or lower than the dielectric breakdown voltage of the voltage converter.

26. The voltage generating circuit as claimed in claim 25, wherein output voltages of the plurality of first operational amplifiers at the time of power activation and in a non-operative state are fixed to a power supply voltage or a voltage in a power supply voltage range of the first operational amplifiers.

27. The voltage generating circuit as claimed in claim 25, wherein the output selecting switch selects one of outputs of the plurality of first operational amplifiers, and when the outputs of the plurality of first operational amplifiers are switched, before the output selecting switch connected to a first operational amplifier subsequently selected is turned on, the operational amplifier subsequently selected outputs a power supply voltage or a voltage in a power supply voltage range thereof, and when an output voltage of the output terminal becomes equal to the above described power supply voltage or a voltage level in the above described power supply voltage range, the above described output selecting switch connected to the first operational amplifier subsequently selected is turned on.

28. The voltage generating circuit as claimed in claim 24, wherein the variable resistance comprises:

a plurality of resistances serially connected to each other; and resistance selecting switches provided between a connecting point at which the adjacent resistances are connected to each other and the output terminal, wherein the resistance selecting switches open and close in accordance with the control by the controller.

29. A voltage generating circuit comprising:

a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, and a voltage level of the high-voltage-side power supply in the output unit is set to be higher than a voltage level of the high-voltage-side power supply in the voltage converter, wherein the voltage converter comprises:

an operational amplifier provided with an input terminal to which the reference voltage is inputted, an inversion input terminal and an output terminal;

a variable resistance connected to the output terminal and ground; and a controller for controlling the operational amplifier, and wherein the operational amplifier is configured to operate as a non-inversion amplifier, and the variable resistance has a plurality of resistance-dividing points connected to the inversion input terminal and selects the resistance-dividing points in accordance with the control by the controller.

30. The voltage generating circuit as claimed in claim 29, wherein the variable resistance comprises:

a plurality of resistances serially connected to each other; and resistance selecting switches provided between a connecting point at which the adjacent resistances are connected to each other and the output terminal, wherein the resistance selecting switches open and close in accordance with the control by the controller.

31. A voltage generating circuit comprising:

a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, a voltage difference between the high-voltage-side power supply and the low-voltage-side power supply in the voltage converter is set to be smaller than a voltage difference between the high-voltage-side power supply and the low-voltage-side power supply in the output unit, and a dielectric breakdown voltage of the voltage converter is set to be smaller than a dielectric breakdown voltage of the output unit, wherein the voltage converter comprises:

an operational amplifier provided with an input terminal to which the reference voltage is inputted, an inversion input terminal and an output terminal;

a variable resistance connected to the output terminal and ground; and a controller for controlling the operational amplifier, and wherein the operational amplifier is configured to operate as a non-inversion amplifier, and the variable resistance has a plurality of resistance-dividing points connected to the inversion input terminal and selects the resistance-dividing points in accordance with the control by the controller.

32. The voltage generating circuit as claimed in claim 31, wherein the variable resistance comprises:

a plurality of resistances serially connected to each other; and resistance selecting switches provided between a connecting point at which the adjacent resistances are connected to each other and the output terminal, wherein the resistance selecting switches open and close in accordance with the control by the controller.

33. A voltage generating circuit comprising:

a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, a voltage difference between the high-voltage-side power supply and the low-voltage-side power supply in the voltage converter is set to be higher than a voltage difference between the high-voltage-side power supply and the low-voltage-side power supply in the output unit, and a dielectric breakdown voltage of the voltage converter is set to be higher than a dielectric breakdown voltage of the output unit, wherein the voltage converter comprises:

an operational amplifier provided with an input terminal to which the reference voltage is inputted, an inversion input terminal and an output terminal;

a variable resistance connected to the output terminal and ground; and a controller for controlling the operational amplifier, and wherein the operational amplifier is configured to operate as a non-inversion amplifier, and the variable resistance has a plurality of resistance-dividing points connected to the inversion input terminal and selects the resistance-dividing points in accordance with the control by the controller.

34. The voltage generating circuit as claimed in claim 33, wherein the variable resistance comprises:

a plurality of resistances serially connected to each other; and resistance selecting switches provided between a connecting point at which the adjacent resistances are connected to each other and the output terminal, wherein the resistance selecting switches open and close in accordance with the control by the controller.

35. A voltage generating circuit comprising:

a voltage converter for voltage-converting a reference voltage; and an output unit for impedance-converting the voltage outputted from the voltage converter, wherein a low-voltage-side power supply and a high-voltage-side power supply are connected to the voltage converter, the output unit comprises a plurality of first operational amplifiers, at least a low-voltage-side power supply and at least a high-voltage-side power supply are connected to the first operational amplifier, output voltages of the high-voltage-side power supply and the low-voltage-side power supply in the first operational amplifier are set to stay within a voltage difference range between a voltage higher than an output voltage of the high-voltage-side power supply in the voltage converter and a voltage lower than an output voltage of the low-voltage-side power supply in the voltage converter, and a dielectric breakdown voltage of the output unit is set to be equal to or lower than a dielectric breakdown voltage of the voltage converter, wherein the voltage converter comprises:

a second operational amplifier provided with an input terminal to which the reference voltage is inputted, an inversion input terminal and an output terminal;

a variable resistance connected to the output terminal and ground; and a controller for controlling the second operational amplifier, and wherein the second operational amplifier is configured to operate as a non-inversion amplifier, and the variable resistance has a plurality of resistance-dividing points connected to the inversion input terminal and selects the resistance-dividing points in accordance with the control by the controller.

36. The voltage generating circuit as claimed in claim 35, wherein the variable resistance comprises:

a plurality of resistances serially connected to each other; and resistance selecting switches provided between a connecting point at which the adjacent resistances are connected to each other and the output terminal, wherein the resistance selecting switches open and close in accordance with the control by the controller.

37. A voltage generating circuit comprising:

a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, and a voltage level of the high-voltage-side power supply in the output unit is set to be higher than a voltage level of the high-voltage-side power supply in the voltage converter, wherein the voltage converter comprises:

an operational amplifier provided with an input terminal to which the reference voltage is inputted, an inversion input terminal and an output terminal;

a variable resistance connected to the output terminal and the input terminal; and a controller for controlling the operational amplifier, and wherein the operational amplifier is configured to operate as an inversion amplifier, and the variable resistance has a plurality of resistance-dividing points connected to the inversion input terminal and selects the resistance-dividing points in accordance with the control by the controller.

38. The voltage generating circuit as claimed in claim 37, wherein the variable resistance comprises:

a plurality of resistances serially connected to each other; and resistance selecting switches provided between a connecting point at which the adjacent resistances are connected to each other and the output terminal, wherein the resistance selecting switches open and close in accordance with the control by the controller.

39. A voltage generating circuit comprising:

a voltage converter for voltage-converting a reference voltage; and an output unit for impedance-converting the voltage outputted from the voltage converter, wherein a low-voltage-side power supply and a high-voltage-side power supply are connected to each of the voltage converter and the output unit, a voltage difference between the high-voltage-side power supply and the low-voltage-side power supply in the voltage converter is set to be smaller than a voltage difference between the high-voltage-side power supply and the low-voltage-side power supply in the output unit, and a dielectric breakdown voltage of the voltage converter is set to be smaller than a dielectric breakdown voltage of the output unit, wherein the voltage converter comprises:

an operational amplifier provided with an input terminal to which the reference voltage is inputted, an inversion input terminal and an output terminal;

a variable resistance connected to the output terminal and the input terminal; and a controller for controlling the operational amplifier, and wherein the operational amplifier is configured to operate as an inversion amplifier, and the variable resistance has a plurality of resistance-dividing points connected to the inversion input terminal and selects the resistance-dividing points in accordance with the control by the controller.

40. The voltage generating circuit as claimed in claim 39, wherein the variable resistance comprises:
- a plurality of resistances serially connected to each other; and
- resistance selecting switches provided between a connecting point at which the adjacent resistances are connected to each other and the output terminal,
- wherein the resistance selecting switches open and close in accordance with the control by the controller.

41. A voltage generating circuit comprising:
- a voltage converter for voltage-converting a reference voltage; and
- an output unit for impedance-converting the voltage outputted from the voltage converter,
- wherein a low-voltage-side a high-voltage-side power supply are connected to each of the voltage converter and the output unit,
- a voltage difference between the high-voltage-side power supply and the low-voltage-side power supply in the voltage converter is set to be higher than a voltage difference between the high-voltage-side power supply and the low-voltage-side power supply in the output unit, and
- a dielectric breakdown voltage of the voltage converter is set to be higher than a dielectric breakdown voltage of the output unit,
- wherein the voltage converter comprises:
- an operational amplifier provided with an input terminal to which the reference voltage is inputted, an inversion input terminal and an output terminal;
- a variable resistance connected to the output terminal and the input terminal; and
- a controller for controlling the operational amplifier, and
- wherein the operational amplifier is configured to operate as an inversion amplifier, and
- the variable resistance has a plurality of resistance-dividing points connected to the inversion input terminal and selects the resistance-dividing points in accordance with the control by the controller.

42. The voltage generating circuit as claimed in claim 41, wherein the variable resistance comprises:
- a plurality of resistances serially connected to each other; and
- resistance selecting switches provided between a connecting point at which the adjacent resistances are connected to each other and the output terminal,
- wherein the resistance selecting switches open and close in accordance with the control by the controller.

43. A voltage generating circuit comprising:
- a voltage converter for voltage-converting a reference voltage; and
- an output unit for impedance-converting the voltage outputted from the voltage converter,
- wherein a low-voltage-side power supply and a high-voltage-side power supply are connected to the voltage converter,
- the output unit comprises a plurality of first operational amplifiers,
- at least a low-voltage-side power supply and at least a high-voltage-side power supply are connected to the first operational amplifier,
- output voltages of the high-voltage-side power supply and the low-voltage-side power supply in the first operational amplifier are set to stay within a voltage difference range between a voltage higher than an output voltage of the high-voltage-side power supply in the voltage converter and a voltage lower than an output voltage of the low-voltage-side power supply in the voltage converter, and
- a dielectric breakdown voltage of the output unit is set to be equal to or lower than a dielectric breakdown voltage of the voltage converter,
- wherein the voltage converter comprises:
- a second operational amplifier provided with an input terminal to which the reference voltage is inputted, an inversion input terminal and an output terminal;
- a variable resistance connected to the output terminal and the input terminal; and
- a controller for controlling the second operational amplifier, and
- wherein the second operational amplifier is configured to operate as an inversion amplifier, and
- the variable resistance has a plurality of resistance-dividing points connected to the inversion input terminal and selects the resistance-dividing points in accordance with the control by the controller.

44. The voltage generating circuit as claimed in claim 43, wherein the variable resistance comprises:
- a plurality of resistances serially connected to each other; and
- resistance selecting switches provided between a connecting point at which the adjacent resistances are connected to each other and the output terminal,
- wherein the resistance selecting switches open and close in accordance with the control by the controller.

* * * * *